United States Patent
Stork et al.

(10) Patent No.: US 10,404,908 B2
(45) Date of Patent: Sep. 3, 2019

(54) OPTICAL SYSTEMS AND METHODS SUPPORTING DIVERSE OPTICAL AND COMPUTATIONAL FUNCTIONS

(71) Applicant: Rambus Inc., Sunnyvale, CA (US)

(72) Inventors: David G. Stork, Portola Valley, CA (US); Patrick R. Gill, Sunnyvale, CA (US); Evan L. Erickson, Chapel Hill, NC (US); Mark D. Kellam, Siler City, NC (US); Alexander C. Schneider, Los Altos, CA (US); Jay Endsley, Santa Clara, CA (US); Salman Kabir, Santa Clara, CA (US)

(73) Assignee: Rambus Inc., Sunnyvale, CA (US)

( * ) Notice: Subject to any disclaimer, the term of this patent is extended or adjusted under 35 U.S.C. 154(b) by 65 days.

(21) Appl. No.: 15/739,868

(22) PCT Filed: Jun. 15, 2016

(86) PCT No.: PCT/US2016/037529
§ 371 (c)(1),
(2) Date: Dec. 26, 2017

(87) PCT Pub. No.: WO2017/011125
PCT Pub. Date: Jan. 19, 2017

(65) Prior Publication Data
US 2018/0191953 A1    Jul. 5, 2018

Related U.S. Application Data

(60) Provisional application No. 62/191,567, filed on Jul. 13, 2015.

(51) Int. Cl.
*G02B 5/18* (2006.01)
*H04N 5/232* (2006.01)
(Continued)

(52) U.S. Cl.
CPC ....... *H04N 5/23229* (2013.01); *G02B 3/0006* (2013.01); *G02B 5/18* (2013.01);
(Continued)

(58) Field of Classification Search
CPC .... G02B 5/18; G02B 3/0006; G02B 27/4205; H01L 27/14625
See application file for complete search history.

(56) References Cited

U.S. PATENT DOCUMENTS

| | | | |
|---|---|---|---|
| 8,530,811 B2 | 9/2013 | Molnar et al. | |
| 2002/0088952 A1* | 7/2002 | Rao | G01N 21/9501 250/559.45 |

(Continued)

OTHER PUBLICATIONS

Garcia-Martinez et al., "Generation of Bessel Beam Arrays Through Dammann Gratings", Mar. 20, 2012, vol. 51, No. 9, Applied Optics. pp. 1375-1381. 7 pages.

(Continued)

*Primary Examiner* — Thai Q Tran
*Assistant Examiner* — Jose M Mesa
(74) *Attorney, Agent, or Firm* — Silicon Edge Law Group LLP; Arthur J. Behiel

(57) ABSTRACT

An imaging system includes multiple diffractive optical gratings disposed over a two-dimensional array of photosensitive pixels. The different gratings present different patterns and features that are tailored to produce point-spread responses that emphasize different properties of an imaged scene. The different responses are captured by the pixels, and data captured from the responses can be used separately or together to analyze aspects of the scene. The imaging systems can include circuitry to analyze the image data, and to support modes that select between point-spread responses, selections of the pixels, and algorithms for analyzing image data.

24 Claims, 18 Drawing Sheets

(51) Int. Cl.
    *H01L 27/146*    (2006.01)
    *G02B 27/42*     (2006.01)
    *G02B 3/00*      (2006.01)
    *G06K 9/00*      (2006.01)
    *G06K 9/62*      (2006.01)

(52) U.S. Cl.
    CPC ..... *G02B 27/4205* (2013.01); *G06K 9/00228* (2013.01); *G06K 9/6215* (2013.01); *H01L 27/14625* (2013.01); *G02B 2005/1804* (2013.01)

(56) References Cited

U.S. PATENT DOCUMENTS

| | | |
|---|---|---|
| 2003/0133801 A1 | 7/2003 | Giger et al. |
| 2007/0187581 A1 | 8/2007 | Ohmura et al. |
| 2011/0026593 A1 | 2/2011 | New et al. |
| 2012/0008747 A1 | 1/2012 | Rosessl et al. |
| 2012/0188556 A1 | 7/2012 | Nagai |
| 2012/0189101 A1 | 7/2012 | Kaneko |
| 2013/0070895 A1 | 3/2013 | Ouchi |
| 2013/0202081 A1 | 8/2013 | Rossl |
| 2013/0208864 A1 | 8/2013 | Rossl |
| 2013/0235973 A1* | 9/2013 | Murakoshi ........... A61B 6/4233 378/37 |
| 2015/0061065 A1 | 3/2015 | Gill et al. |

OTHER PUBLICATIONS

Guerneau, N. et al., "Generation of Achromatic and Propagation-Invariant Spot Arrays by Use of Continuously Self-Imaging Gratings", vol. 26, No. 7, Apr. 1, 2001. 3 pages.

Horisaki, Ryoichi et al., "Regularized Image Reconstruction for Continuously Self-Imaging Gratings" vol. 52, No. 16, Jun. 1, 2013. 10 pages.

Notification Concerning Transmittal of Copy of International Preliminary Report on Patentability dated Jan. 25, 2018 re: Int'l Appln. No. PCT/US16/037529. 10 pages.

Notification of Transmittal of the International Search Report and the Written Opinion of the International Searching Authority, or the Declaration dated Sep. 1, 2016 re: Int'l Appln. No. PCT/US2016/037529. 11 pages.

Piponnier, Martin et al., "Relevance of Continuously Self-Imaging Gratings for Noise Robust Imagery", vol. 37 No. 17, Sep. 1, 2012. 3 pages.

* cited by examiner

750

$f_1$

| | |
|---|---|
| 505 | *p1*, p2, p3, p4, p5, p6, p7 |
| 510 | p8, p9 |
| 515 | p1, p2, p3, p4 |
| 520 | p1, p2, p3, p4 |
| 525 | p1, p2, p3, p4 |
| 705 | p1, p2, p3, p4, p5, p6, p7 |

$f_2$

| | |
|---|---|
| 505 | p1, p2, p3, p4, p5, p6, *p7* |
| 510 | p8, p9 |
| 515 | p1, p2, p3, p4 |
| 520 | p1, p2, p3, p4 |
| 525 | p1, p2, p3, p4 |
| 705 | p1, p2, p3, p4, p5, p6, p7 |

$f_3$

| | |
|---|---|
| 505 | p1, p2, p3, p4, p5, p6, *p7* |
| 510 | p8, *p9* |
| 515 | p1, p2, p3, p4 |
| 520 | p1, p2, p3, p4 |
| 525 | p1, p2, p3, p4 |
| 705 | p1, p2, p3, p4, p5, p6, p7 |

$f_4$

| | |
|---|---|
| 505 | p1, p2, *p3*, p4, *p5*, p6, p7 |
| 510 | p8, p9 |
| 515 | p1, p2, p3, p4 |
| 520 | p1, p2, p3, p4 |
| 525 | p1, p2, p3, p4 |
| 705 | p1, p2, *p3*, p4, *p5*, p6, p7 |

$f_5$

| | |
|---|---|
| 505 | p1, p2, *p3*, p4, p5, *p6*, p7 |
| 510 | p8, p9 |
| 515 | p1, p2, p3, p4 |
| 520 | p1, p2, p3, p4 |
| 525 | p1, p2, p3, p4 |
| 705 | p1, p2, *p3*, p4, p5, *p6*, p7 |

$f_6$

| | |
|---|---|
| 505 | p1, p2, *p3*, *p4*, p5, p6, p7 |
| 510 | p8, p9 |
| 515 | p1, p2, *p3*, *p4* |
| 520 | p1, p2, *p3*, *p4* |
| 525 | p1, p2, *p3*, *p4* |
| 705 | p1, p2, *p3*, *p4*, p5, p6, p7 |

FIG. 7C

OPTICAL SYSTEMS AND METHODS SUPPORTING DIVERSE OPTICAL AND COMPUTATIONAL FUNCTIONS

BACKGROUND

Optics can be thought of as performing mathematical operations transforming light intensities from different incident angles to locations on a two-dimensional image sensor. In the case of focusing optics, this transformation is the identity function: each angle is mapped to a distinct corresponding point on the sensor. When focusing optics are impractical due to size, cost, or material constraints, the right diffractive optic can perform an operation other than the identity function that is nonetheless useful to produce a final image. In such cases the sensed data may bear little or no resemblance to the captured scene; however, a desired digital image can be computed from the sensor outputs.

BRIEF DESCRIPTION OF THE DRAWINGS

The present invention is illustrated by way of example, and not by way of limitation, in the figures of the accompanying drawings and in which like references refer to similar elements and in which:

FIG. 7C is a table 750 relating each grating to compatible processes.

FIG. 10C depicts an imaging system 1060 in which a pair of identical gratings 1000(1) and 1000(2) are disposed in an aperture layer 1065 over image sensor 1004 of FIG. 10B, with like-identified elements being the same or similar.

DETAILED DESCRIPTION

Figure 1A:
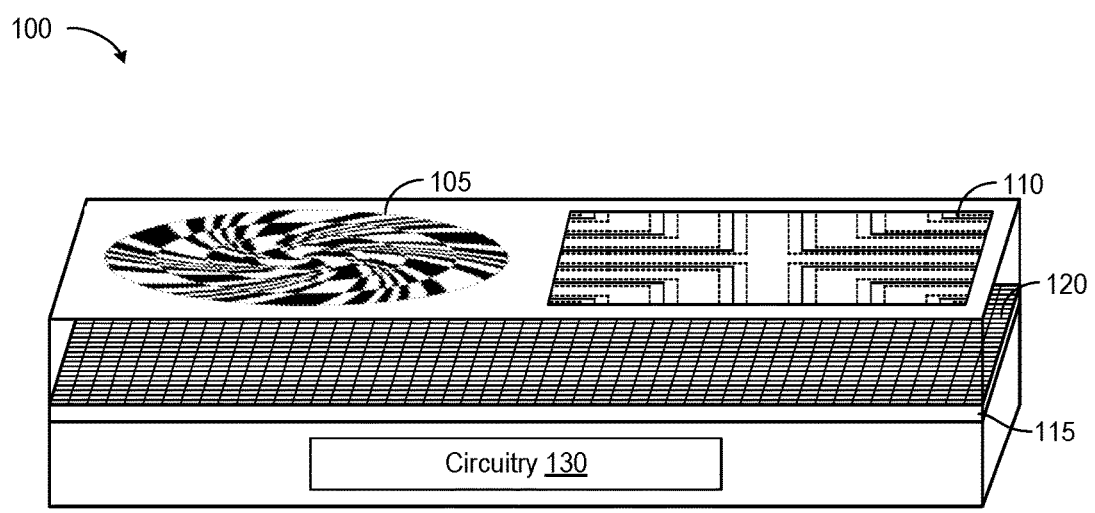
FIG. 1A depicts an imaging system 100 with two diffractive optical phase gratings 105 and 110 disposed over a two-dimensional array 115 of photosensitive pixels 120.

FIG. 1A depicts an imaging system 100 with two diffractive phase gratings 105 and 110 disposed over a two-dimensional array 115 of photosensitive pixels 120. Gratings 105 and 110 perform different optical functions of a given scene to generate respective sets of image data that emphasize different properties of the imaged scene. Different computational functions can be applied to the disparate sets of image data, with each function tailored to accommodate the properties emphasized by the respective grating. Information acquired using gratings 105 and 110 can be used separately, as to image different types of scenes, or can be used together to produce more complete representations of imaged scenes than could be produced using either grating alone.

Gratings 105 and 110 are each patterns of features that create lines of odd symmetry. These features, some of which are detailed below in connection with FIG. 12 through 19, offer considerable insensitivity to the wavelength of incident light over a wavelength band of interest, and also to the manufactured distance between gratings 105 and 110 and the underlying array of pixels 120. The features of gratings 105 and 110 are tailored to exhibit respective point-spread functions (PSFs). Array 115 samples interference patterns produced by light from imaged scenes. Circuitry 130 (e.g., a processor and memory) can use this sampled image data and knowledge of the PSFs to e.g. compute images, make decisions, or identify features or qualities of interest in observed scenes. Circuitry 130 can be integrated into imaging system 100, provided remotely, or distributed between local and remote compute resources.

In this example, grating 105 and its applied computational functions are optimized for face recognition, and grating 110 and its applied computational functions for scanning barcodes. The PSF of grating 105 provides a rich set of data descriptive of spatial frequencies over a continuous range of angles to enable imaging system 100 to discriminate faces. In contrast, grating 110 includes parallel and perpendicular features with a diversity of widths and spacings to sample a sufficient number of spatial frequencies to discriminate barcodes. Grating 110 deemphasizes image features that are relatively unhelpful or unnecessary for discriminating barcodes, features such as points, curves, and lines tipped at angles to the preferred orientation of an imaged barcode. Gratings 105 and 110 can be integrated with array 115 at very low cost, so imaging system 100 could be practical for use or sale in connection with either face recognition or barcode reading, or could support applications that require or benefit from the ability to do both.

Figure 1B:
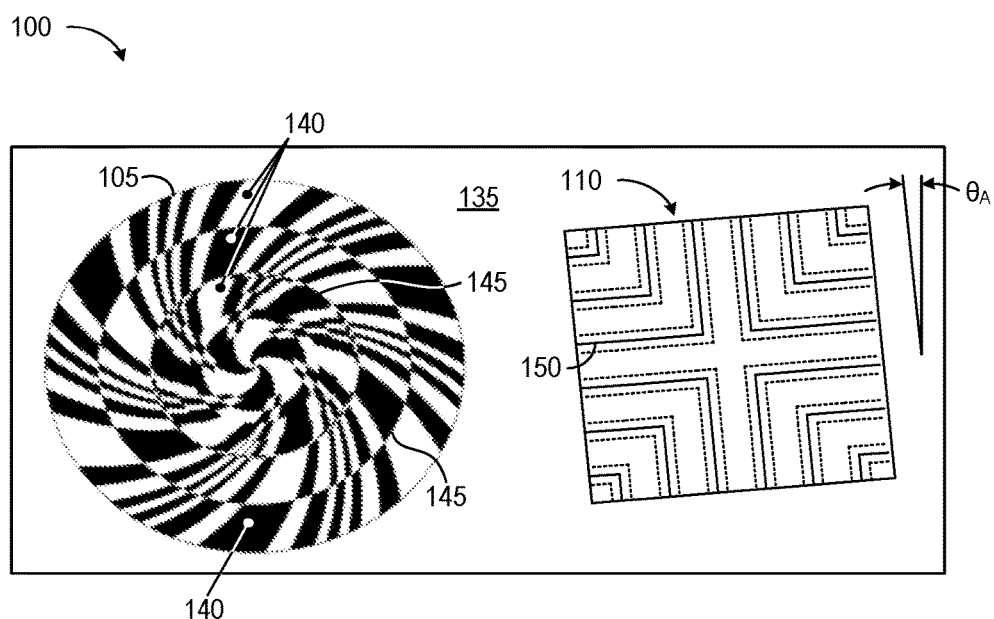
FIG. 1B is a plan view of imaging system 100 that more clearly illustrates gratings 105 and 110.

FIG. 1B is a plan view of imaging system 100 that more clearly illustrates gratings 105 and 110. The areas 135 over imaging system 100 not occupied by gratings 105 and 110 are opaque. Relatively narrow segment spacing works better for relatively high frequencies of incident light, and wider segment spacing works better for lower frequencies of light. Feature spacing increases along odd-symmetry boundaries (between elevated and recessed grating regions, represented by dark and light) with distance from the center of the spiral. Curved boundaries of odd symmetry extend radially from the center of the grating to the periphery, radiating out between the elevated and recessed arms near the center.

The segment widths do not continue to increase with radius, as there is a maximum desired width for a given wavelength band of interest (e.g., the widest may correspond to the lowest frequency of visible red light). The total width of one period of phase antisymmetric features optimized for red light may be the same as the width of one period of a more complicated phase antisymmetric pattern optimized for blue light. It is possible to shift from the former to the latter at certain circles of fixed radius from the center of the design whose circumference corresponds not only to integer multiple of the simple red-optimized designs but also the same integer multiple of the more complicated blue-optimized designs. The features that define the radiating boundaries therefore exhibit discontinuities as they extend from the center toward the periphery of grating 105.

The imaging ability of imaging system 100 relies on the fact that light from different incident angles illuminates different groups of pixels 120 in the photosensor array. In general, gratings that produce more distinctive collections of illuminated pixels, and preserve full Fourier information of an imaged scene, perform better than gratings where several pixels of the photosensor receive the same signal for a range of incident angles. For this reasons, the spiral segments of grating 105 are divided into sub-segments 140 that represent phase reversals. Phase-reversing boundaries 145 between sub-segments are roughly orthogonal to the lines of odd symmetry, and serve to perturb otherwise smooth, relatively linear features. For illustrative purposes, these zones are equally spaced and are strictly radial. Different spacings could be optimal for different wavelengths and sensor-grating spacings, and the zones could take other forms.

Grating 110 has parallel and perpendicular odd-symmetry boundaries 150, which may have features of the same or different widths, or of varying widths along one or more boundaries. Parallel boundaries with the requisite diversity of widths and spacings to sample a sufficient number of spatial frequencies can image one-dimensional scenes, e.g., barcodes or lines. A second set of parallel boundaries is included to image one-dimensional scenes with imaging system 100 at alternative orientations relative to the scene. (Parallel boundaries with the requisite diversity of widths and spacings along two dimensions can also be used to image and track e.g. point sources, such as to identify the position and relative movement of the sun.) Boundaries 150 are at an angle $\theta_A$ with respect to the rows and columns of pixels 120. Angle $\theta_A$ creates more measurement diversity because linear shadows produced by boundaries 150 cover different percentages of pixels in different rows or columns. In one embodiment angle $\theta_A$ is selected so that the top of each boundary is offset from the bottom by about one pixel pitch of array 115.

Figure 2:
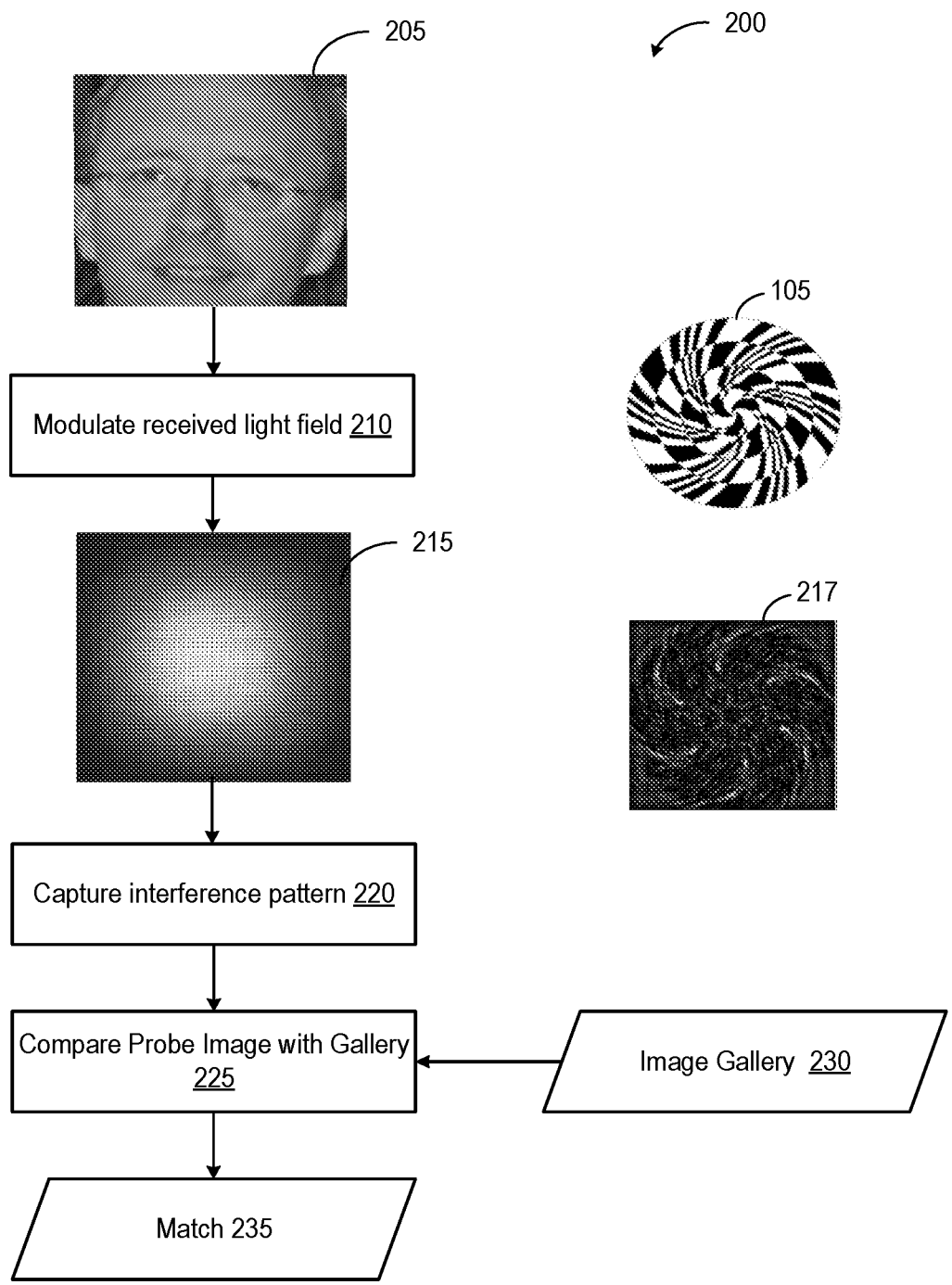
FIG. 2 is a flowchart 200 detailing how imaging system 100 of FIGS. 1A and 1B can use imaging system 100 for face recognition or face-presence detection.

FIG. 2 is a flowchart 200 detailing how imaging system 100 of FIGS. 1A and 1B can use imaging system 100 for face recognition or face-presence detection. Face-recognition systems are computer applications that automatically identify people, in essence answering the question "Who is this?" Such systems are used in authentication, image tagging (e.g. for text-based image search), and other areas. Face-presence systems are similar, but answer the simpler question "Is anyone present?" Face-presence detection can be used in toys, cameras, some electronic appliances, control of advertising displays, and so on. Most face-recognition systems—especially ones where high accuracy is important—rely on high-quality video images and sophisticated video equipment. Smaller, less-expensive equipment would increase the market for both image recognition and presence detection.

Lensless image sensors of the type detailed herein can be used for face recognition and presence detection. In one embodiment, for example, a gallery of face images for known people is taken using lensless image sensors with a specific PSF. A "probe" image of an unknown face taken using a sensor with the same PSF can then be compared with the images in the gallery in search of a match.

The example of FIG. 2 assumes a scene 205 that includes a human face. Grating 105, reproduced here in plan view for ease of review, modulates the received light from scene 205 (step 210) to cast an interference pattern 215 on array 115. Grating 105 is accompanied by an impulse response 217 for grating 105 illuminated normally. As used herein, an "impulse response" refers to the PSF of a grating in combination with the underlying cluster of pixels to a point source or point object. Interference pattern 215 is essentially the superposition of a collection of impulse responses 217, one representing the intensity of light for each point in scene 205.

Imaging system 100, at the direction of circuitry 130, samples interference pattern 215 to create a digital probe image of the face in scene 205 (step 220). The probe image is unintelligible to a human; however, because grating 105 has sharp features in its impulse response, the pattern contains sufficiently rich information about scene 205 to enable imaging system 100 to distinguish the face.

In the next step 225, the captured probe image is compared with a gallery 230 of image data stored in a local or remote database. The image or images in gallery 230 are captured using the same or a similar imaging system. Comparing a probe image against a gallery of references to assign a label to the sample is sometimes referred to as "classification." For face recognition, each "class" represents a person's face, and can include any number of exemplars representative of that face, or a "training vector" computed from one or more exemplars. Sample image data is then compared with the classes to find the class that most closely matches. Many methods of classification are known to those of skill in the art of pattern recognition generally, and in face recognition in particular. As an alternative to such classification, gallery 230 might include one or a few reference images used e.g. to verify ownership or control of imaging system 100. In any event, imaging system 100 generates a match signal 235 responsive to a match between the probe image and an entry in gallery 230.

If the impulse response of the grating is known, probe and gallery image patterns can be inverted to produce human-recognizable images. However, basing the comparisons on raw sensor data (e.g. the sampled interference pattern 215) rather than on a conventional human-recognizable image advantageously avoids the computationally complex process of image inversion. Moreover, using unintelligible gallery and probe images imparts a degree of security. In effect, the image transform imposed by the image sensor is a form of encryption. The pixels underlying grating 110 can be disabled to save power, or sampled image data from beneath grating 110 can be captured and used in comparison step 225. The process of FIG. 2 can be repeated to read a barcode. The steps of such process can be similar to those noted previously, but the captured interference pattern would be taken using those pixels 120 beneath grating 110 and the functionality would be tailored to distinguish barcodes.

In one example, the efficacy of lensless sensors to facial recognition and detection can be demonstrated using a k-nearest-neighbor classifier in which each scene—each face in this example—is represented by a vector of sensor values, x. The category label (name) is that of the person whose training vector x in the reference gallery most closely matches the probe image, or "query vector." A face is deemed "present" if the distance from the query vector to each stored face or the training vector is not larger than some criterion Δ. This criterion depends upon the training dataset, the number of features used, and the application-specific confidence. The features can be, for instance, based on pixel values or collections of pixel values from the raw images where the largest disparities are observed over the training set. If typical non-face query images are similar to those in the database, or if the application demands a penalty for erroneously deciding that a face is present (when none is), then Δ is set small.

The PSF of grating 105, or possibly the impulse response combining the PSF with the underlying array of pixels 120, may be known from a prior calibration or high-fidelity simulation. (The impulse response of grating 105 is represented here as a response 217.) The way in which impulse response 217 varies as a function of incident angle and color may also be similarly determined. A mathematical conversion based on response 217 can be used to construct an image of scene 205 from captured pattern 215. Suitable techniques for converting captured patterns into images are detailed below in connection with FIG. 9.

Figure 3:
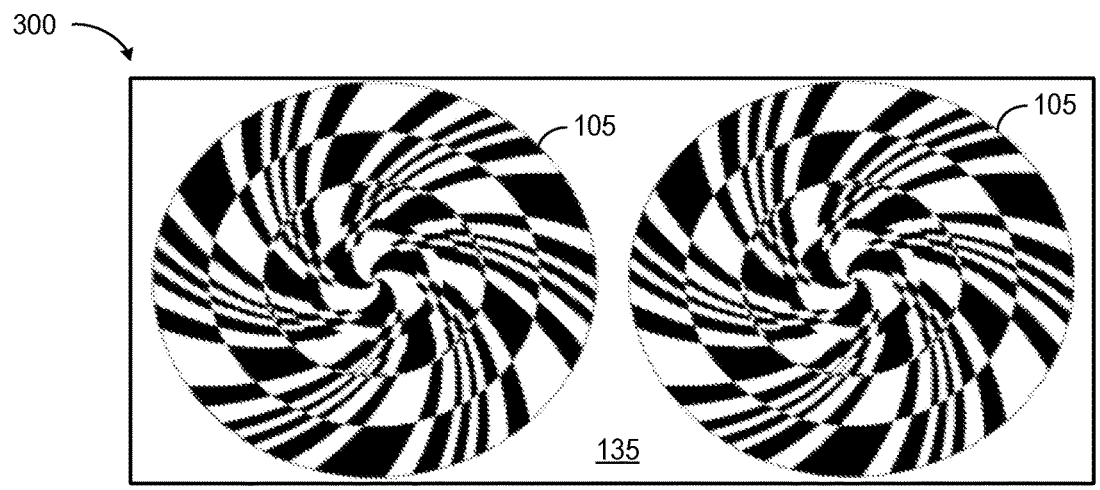
FIG. 3 is a plan view of an imaging system 300 in accordance with another embodiment.

FIG. 3 is a plan view of an imaging system 300 in accordance with another embodiment. Rather than disparate gratings, system 300 includes two similar or identical gratings 105 over a common or separate arrays of photodetectors. Gratings 105 exhibit the same PSF. Combining their impulse responses averages errors, and consequently provides greater signal-to-noise ratios than would a similar sensor with but one grating. Moreover, the physical separation of gratings 105 allows for stereoscopic imaging in support of e.g. binocular depth and looming measurements. The separation of gratings 105 can be increased to enhance binocular image disparity for improved depth perception.

Other embodiment can include more, and possibly many more, similar or identical gratings. In general, m duplicates of some optimized grating can be used. If the noise for such systems is approximately independent between gratings, then a simple averaging of the sensor estimates of the respective impulse responses should lead to an improved overall estimate with variance decreased by a factor of one divided by the square root of m. If there is an estimate of the variance in each grating, then Bayesian integration of estimates will give results that are superior (less bias, less variance) to simple averaging.

The orientation and placement of gratings over a photodetector array can be relevant. For instance, depth estimation based on visual disparity might use two special-purpose gratings placed at opposite corners of the rectangular photodetector array (to form the longest inter-grating baseline). As such, the overall placement of gratings should be optimized for the expected functional uses. If there are photodetector hardware constraints, for instance, that sensor read-rate constraints can be met only if two component gratings are on the same, or on different sensor rows, such constraints should be incorporated into the grating layout optimization procedure.

Figure 4A:
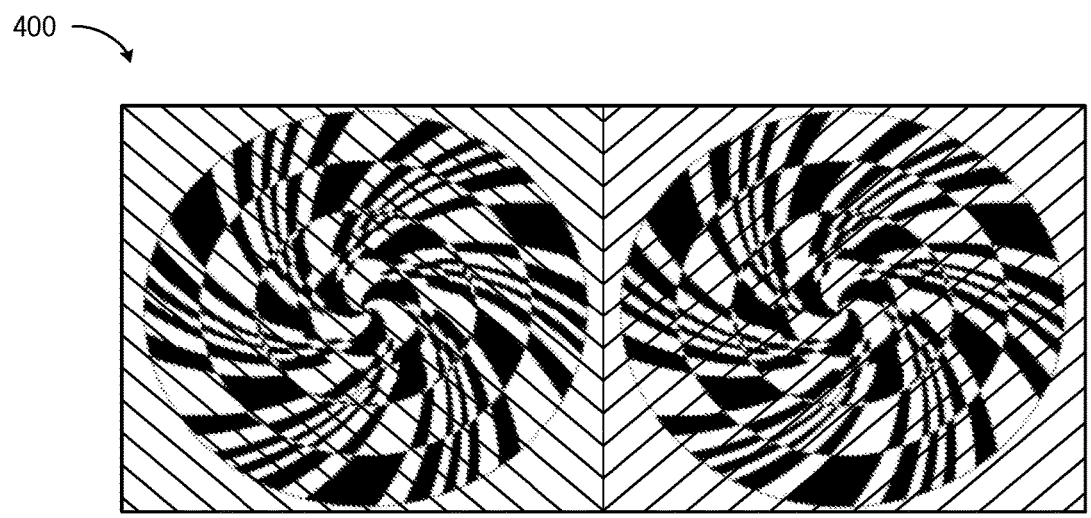
FIGS. 4A and 4B are plan- and cross-sectional views of an imaging system 400 in accordance with another embodiment.
Figure 4B:
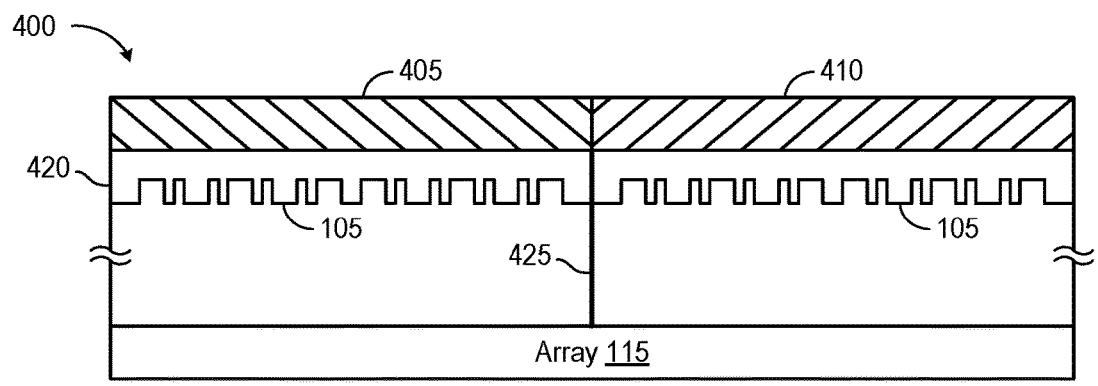

FIGS. 4A and 4B are plan and cross-sectional views of an imaging system 400 in accordance with another embodiment. Imaging system 400 is similar to imaging systems 100 and 300, with like-identified elements being the same or similar. In imaging system 400, left and right gratings 105 are covered with respective layers 405 and 410 of a polarizing material. Layers 405 and 410 polarize light from incoming scenes in different planes (e.g., offset from one another by 90 degrees) so that the resultant pair of impulse responses captured by array 115 emphasize different aspects of the same scene.

The cross-section of FIG. 4B shows a transparent layer 420 overlaying gratings 105 that planarizes the grating surfaces for application of the overlying polarizing materials that make up layers 405 and 410. An opaque barrier 425 extending below and between gratings 105 reduces or eliminates cross-talk between the PSFs captured by array 115. Other embodiments achieve adequate separation via the lateral spacing of the gratings. In either case the PSFs can be said to be "independent." Data sampled by array 115 under the two gratings 105 can be treated to the same or different processes to recover image data of interest.

Figure 5A:
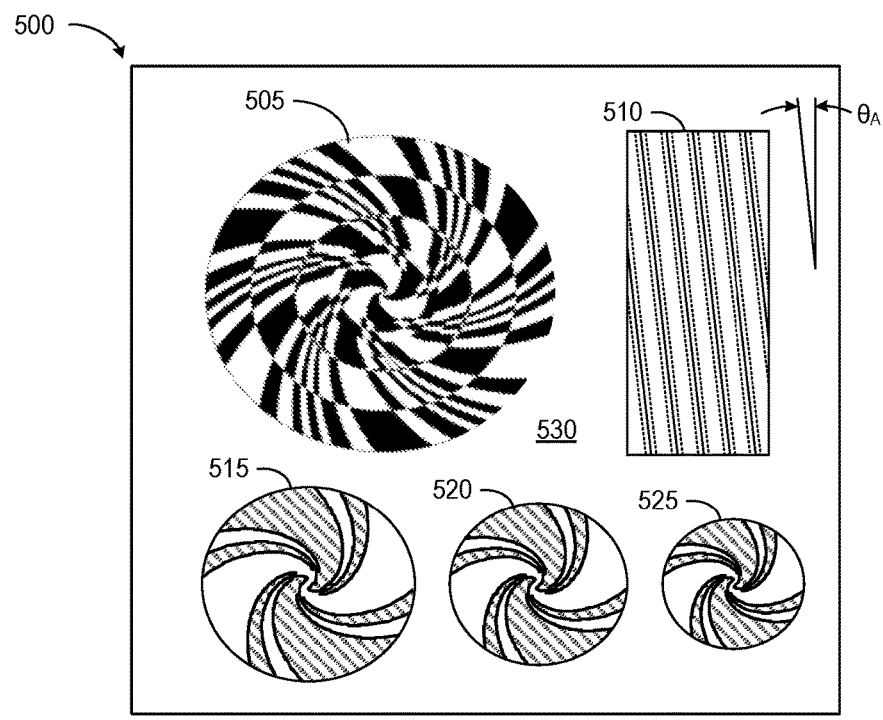
FIGS. 5A and 5B are plan and cross-sectional views of an imaging system 500 in accordance with another embodiment.
Figure 5B:
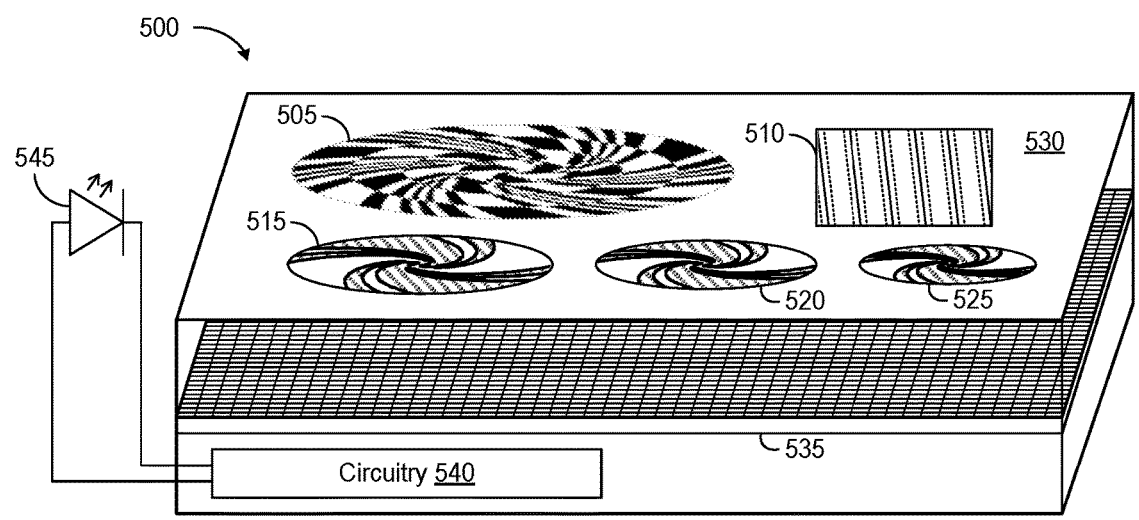

FIGS. 5A and 5B are plan and cross-sectional views of an imaging system 500, integrated into a single sensing device, in accordance with another embodiment. System 500 includes five gratings 505, 510, 515, 520, and 525 formed in an otherwise opaque surface 530 and overlaying an array 535 of pixels. The diverse set of gratings can be used separately to together, in parallel or sequentially. Circuitry 540 captures a point-spread response or responses from any one or any combination of the gratings to perform various imaging functions. One or more light sources 545 can be included to provide light responsive to e.g. detected motion or other image changes to allow system 500 to capture still images or video. For example, IR LEDs can be used in conjunction with a grating optimized for IR wavelengths to detect changes or capture images in low light, and white-light LEDs can be lit responsive to detected motion to enable capture of more detailed images. A single device could include gratings optimized for IR and visible light, switching between or otherwise emphasizing the disparate responses from them based on ambient illumination.

In the depicted embodiment, grating 505 is similar to grating 105 in prior examples except that the spiral form twists counterclockwise. Grating 510 has parallel odd-symmetry boundaries, which may have features of the same or different widths, or of varying widths along one or more boundaries. Parallel boundaries with the requisite diversity of widths and spacings to sample a sufficient number of spatial frequencies can image e.g. barcodes. An angle $\theta_A$ can be introduced for the reasons presented above in connection with FIG. 1B.

Gratings 515, 520, and 525 are similar, but grating 515 is twenty percent larger and grating 525 twenty percent smaller than grating 520. For a given focal depth, light of higher frequencies tends to produce a sharper focus with narrower feature widths. The larger grating 515 is optimized for red light, the medium grating 520 for green light, and the small grating 525 for blue light. Filters can be disposed over the gratings for improved selectivity. The features of the largest grating 505 are spaced to provide suitable spatial-frequency information over the gamut of visible light. (The gratings are not to scale.) Gratings 515, 520, and 525 can be provided with respective color filters instead of or in additional to the feature-size optimizations. Gratings 515, 520, and 525 can be overlapping or concentric in other embodiments.

Circuitry 540 communicates with array 535 to sample the PSFs from gratings 505, 510, 515, 520, and 525; and can include sufficient processing power and memory to perform some or all of the computation required to accomplish whatever task is being asked of system 500.

In one embodiment system 500 combines motion detection with a barcode reader, and can produce human-recognizable color images. System 500 can support a low-power mode that is so efficient that it can be powered using (optionally) an integrated photocell. System 500 can be instantiated in a single package or on a single semiconductor die. Whether implemented on a single die or multiple die, system 500 can be packaged opaquely, with a transmissive window overlying the gratings (and the optional photovoltaic cell).

System 500 supports a low-resolution, low-power mode to sense changes in scene activity, a barcode reader that reads barcodes, and an imaging mode that captures one or more frames of higher-resolution image data. The barcode and imaging modes can be initiated by scene activity, and system 500 can be programmable to function differently depending upon the use case. Gratings of the type detailed herein can be made so inexpensively that many different gratings can be incorporated into a single sensor for sale as a general-purpose imaging device. One, all, or a subset of the resultant PSFs can then be used in service of the desired application.

Human face detection can be based on form alone (as in Viola-Jones face detection and face recognition); detection can also be performed based on chromaticity, which is remarkably consistent among all ages and races. Face recognizers that use both such features have been shown to be more accurate than either of those two taken alone. As such, a simple nearest-neighbor-based face presence detector (for instance) with a simple scene-weighted, chromaticity-based recognizer may be more accurate than either component recognizer alone. Imaging systems in accordance with some embodiments can therefore include gratings and associated computational functions tailored to extract image data representative of facial structures and chromaticity.

Figure 6A:
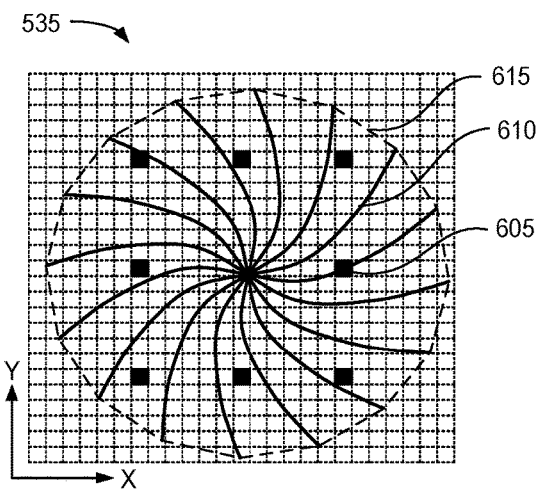
FIG. 6A is a plan view of array 535 of FIG. 5B.

FIG. 6A is a plan view of array 535 of FIG. 5B. Eight nonadjacent pixels 605 are darkened to indicate a subset that is active in the low-power mode. An orientation chirp 610 represents a sharply focused PSF from an exemplary imaged point source as it may appear at the sensor plane. Chirp 610 is illustrated as dark on a light background for ease of illustration, but would appear as a relatively bright pattern on a dark background. Chirp 610 illuminates a set of R pixels within a convex hull 615, the smallest convex set of S pixels that includes all the illuminated pixels. (Convex hull 615 may be visualized as the shape formed by a rubber band stretched around chirp 610.) Chirp 610 provides a rich set of spatial modulations spanning the areas of hull 615 that dramatically increases motion sensitivity.

Conventional image sensors or cameras resolve a point source as a focused "dot" on a sensor array. If a typical camera is to detect very small movements, a rich set of active pixels must be maintained even in a low-power mode. Imagine, for example, that a point source is resolved as a sharp or blurred dot on array 535 such that only one or a collection of neighboring pixels is illuminated. In that case, the point source could move considerably relative to the sensor without detection. At worst, the dot could move between the active pixels 605 and off array 535 without detection.

Chirp 610, a PSF that results from illumination by a point source, includes "arms" of changing light intensity that illuminate many more pixels, including nonadjacent ones, than would a resolved spot. Chirp 610 sweeps across a great many pixels as the point source moves relative to the sensor. Consequently, fewer pixels need be polled to cover the visual field than with a system employing traditional focusing optics. In this example, movement of the point source that moves chirp 610 a pixel or two in any direction within the X-Y plane would impact at least one of the active pixels 605, and could thus be sensed. Sensing may involve analog-to-digital conversions of the signals from the same subset of photodiodes at different points in time. In other embodiments, analog sample-and-hold circuits and comparators can be used to signal changes in the imaged field of view. Depending upon the application, such sensed motion could be the information of interest, or could be used to bring system 500 out of the low-power mode to e.g. read a barcode or take and store one or more frames of relatively high resolution data.

Some embodiments support additional operational modes, or "stages." In one embodiment, for example, circuitry 540 supports a three-state machine comprising a sentinel stage, a tentative stage, and a confirmation stage. In the sentinel stage, n1 pixels are monitored and if k1 (<n1) of these pixels change by a criterion value $\theta_1$ between successive image frames, then the state machine transitions to the tentative stage. In the tentative stage, n2 pixels are monitored and if k2 (<n2) of these change by a criterion value $\theta_2$ between successive frames, then the state machine transitions to state 3, otherwise the system reverts to state 1. If the system is in state 3, n3 pixels are monitored and if k3 (<n3) of these pixels change by a criterion value $\theta_3$ between successive frames, then the state machine emits a signal denoting image change detected and remains in state 3, otherwise the system transitions to state 2.

One benefit of this system is that, because of the grating optics, each photodetector pixel responds to a range of positions in the field of view; thus the number of pixels that should be monitored is lower (dissipating lower power) than in a traditional lens-based system, in which each pixel responds to a very small range of positions in the field of view. Circuit analyses show that some embodiments can obtain sub-400 nW image change detection, with the power required for an analog-to-digital converter (ADC) dominating. Address generator circuits for polling subsets of pixels in support of reduced power consumption are well known to those of skill in the art, so a detailed discussion is omitted.

A photovoltaic cell integrated with system 500 can provide sufficient power to support the low-power mode in ambient light, with enough extra to charge integrated or external energy-storage devices capable of supporting bursts of use in the high-performance mode. In some embodiments system 500 includes a separate or integrated RFID chip and associated antenna to allow image data to be retrieved wirelessly. System 500 can support other forms of wired or wireless connections, as will be understood by those of skill in the art.

Returning to FIG. 5B, array 535 and the overlying gratings can be created using standard CMOS processes. Virtually any integrated circuit that might benefit by inclusion of an imaging device can thus be adapted to include one. For example, a technology referred to as "smartdust" describes systems in which many microelectromechanical systems (MEMS) can be operated on a distributed, wireless computer network to collectively perform various sensing and communication tasks. Smartdust devices can be on the order of a few millimeters on a side, which is easily sufficient to incorporate a sensor of the type detailed herein. In one embodiment, for example, a 128×128-pixel sensor is 200 microns on a side. Image sensors of the type detailed herein can be integrated so inexpensively that they can be incorporated into credit cards and other forms of identification for security purposes, or to facilitate vision systems in the field of microrobotics.

Figure 6B:
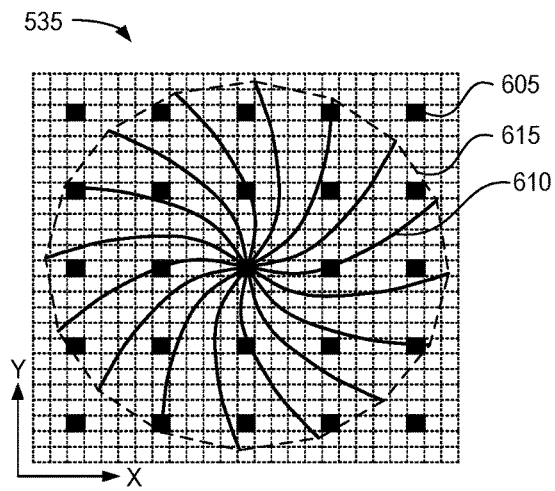
FIG. 6B depicts array 535 of FIGS. 5A, 5B, and 6A with twenty-five nonadjacent pixels 605 darkened to indicate a subset n2 that is active in an example of a tentative mode in which an increased number of pixels are polled for increased motion sensitivity.

FIG. 6B depicts array 535 of FIGS. 5A, 5B, and 6A with twenty-five nonadjacent pixels 605 darkened to indicate a subset n2 that is active in an example of a tentative mode in which an increased number of pixels are polled for increased motion sensitivity. Though not apparent in this image, sensitivity can also be changed by e.g. adjusting intensity-change thresholds and frame rates. Should motion be detected in this mode, the imaging device can enter a confirmation stage in which all the pixels are polled. The resultant frames can then be used to confirm motion, and can be used to produce images that can be understood by a human observer. The resultant frames can be stored locally and read later, or can be transmitted to a remote device. The production of images from human observers can likewise be done locally or remotely. In some embodiments confirmed motion can activate and direct a separate, higher-resolution imaging system.

FIGS. 6A and 6B depict an exemplary chirp 610 that defines convex hull 615. To find the convex hull for a given imaging device, chirp 610 can be captured by the sensor array. With the brightest pixel(s) serving as a reference, those pixels with at least 10% of that maximum brightness are included in the set of pixel values representative of the response. Convex hull 655 is the smallest convex set of pixels that includes that set of pixel values. The convex hull is not used for image acquisition or analysis, but affords a measure of response area that can be used to characterize the ratio of active pixels relative to the response and the richness of spatial modulations. In this example, chirp 610 includes many and diverse spiral "arms" that collectively provide much more information for detecting motion than would a focused spot.

The examples of FIGS. 6A and 6B include but one PSF each, and the responses are nearly as large as the pixel array. Detectors in accordance with other embodiments support more or fewer PSFs, and each can occupy a larger or smaller convex hull. For example, an image detector can employ multiple adjacent or spaced gratings to produce a collective PSF that exhibits a web of features that can be distributed over all or a portion of an underlying array, or areas of the array can be separated by space and/or opaque barriers that prevent crosstalk between light from separate gratings that share the same photodetector array.

Figure 6C:
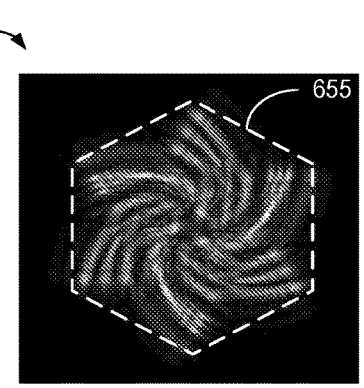
FIG. 6C depicts an exemplary point-spread function 650.

FIG. 6C depicts an exemplary PSF 650. A convex hull 655 is the smallest convex set of pixels that includes all those with intensity values of at least 10% of the maximum value. Imaging systems with multiple gratings can produce multiple PSFs on the same photosensitive array, with the various PSFs defining separate or overlapping convex hulls of varying sizes and shapes.

Figure 6D:
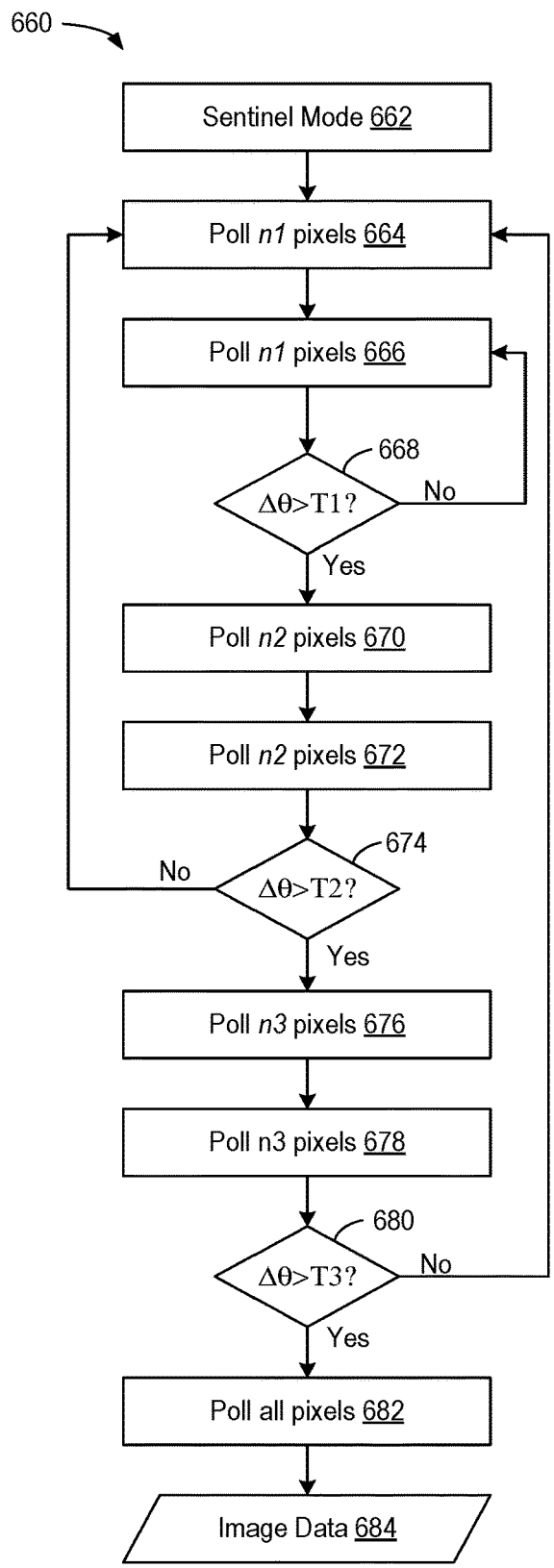
FIG. 6D is a flowchart 660 illustrating a method of detecting apparent motion in accordance with one embodiment of system 500 of FIGS. 5A and 5B.

FIG. 6D is a flowchart 660 illustrating a method of detecting apparent motion in accordance with one embodiment of system 500 of FIGS. 5A and 5B. This example assumes the use of data from the response of grating 505, but any grating or combination of gratings can be used. Circuitry 540 automatically enters the low-power sentinel mode on power up (662). Once in this mode, circuitry 540 repeatedly polls n1 pixels to produce small frames of image data (664/666). The n1 pixels are a small subset of the total available under grating 505, and an even smaller fraction of the total for array 535. Power usage is thus minimized. Successive frames are compared to identify differences.

For any successive pair of frames, per a decision 668, if some or a combination of corresponding pixel values exhibit intensity changes Δθ that exceed a threshold T1, then circuitry 540 enters a tentative mode in which circuitry 540 repeatedly polls n2 pixels, wherein n2>n1 but is still a subset of the total available in array 535, to produce larger frames of image data (670/672).

Per decision 674, system 500 determines whether some or a combination of corresponding pixel values from the successive frames taken in the tentative mode exhibit intensity changes Δθ that exceed a threshold T2. System 500 can remain in the tentative mode for some number of frames without intensity changes meeting threshold T2, but will eventually return to the sentinel state to save power. Should threshold T2 be met, circuitry 540 enters a more power-intensive confirmation mode in which circuitry 540 repeatedly polls n3 pixels (676/678).

In this example, the value n3 represents all the pixels that receive light via grating 505. For any successive pair of frames, per a decision 680, if some or a combination of corresponding pixel values exhibit intensity changes Δθ that exceed a third threshold T3, then circuitry 540 confirms detection of movement and, in this example, polls all the pixels in array 535 to capture an image at the full resolution of system 500 (682). The resultant image data 684 can be saved locally or remotely. In some embodiments, circuitry 540 computationally inverts image data 684 to produce a human-intelligible image, which can likewise be stored locally or remotely.

System 500 can remain in the confirmation mode for some number of frames without intensity changes meeting threshold T3, during which time system 500 can perform various imaging tasks using any or a combination of gratings 505, 510, 515, 520, and 525. Absent sensed movement, or responsive to power or time constraints, circuitry 540 can return to the sentinel mode. In other embodiments system 500 can transition to the tentative mode before continuing to the sentinel mode. In embodiments that are power limited, system 500 can enter a standby mode or one of the lower-power modes despite detected motion to allow time to generate or store sufficient power to return to the task of motion detection.

The thresholds T1, T2, and T3 used in the different modes can be different, each tailored for the needs of the different modes. Also, the different modes can be accompanied by changes in e.g. frame rate and the integration time employed by an ADC (not shown) that samples the intensity values from array 535 to acquire image data. While a single array of photosensitive elements, array 535 can be logically separated into separately powered rows, columns, and grating-specific areas and sub-areas to optimize power usage in each operational mode.

Comparisons of successive sets of image data are not limited to just two sets, or to adjacent sets. For example, frames can be averaged or otherwise combined to reduce the effects of noise, and individual or averaged sets of frames can be compared with earlier individual or averaged sets of frames. Change detection may also be based on comparisons with multiple distinct sets of reference data. For example, an image sensor experiencing motion due to e.g. wind may produce a large but finite number of distinct reference frames or sub-frames that represent no movement within a scene. The same might be true where wind disturbs elements of scene (e.g., a waving branch). A detector might learn such sets and indicate change only when the most recent set of image data fails to match any in the preceding sets. Motion might also be confirmed by referencing data from other gratings or combinations of gratings rather than or in addition to changes in pixel counts, thresholds, or the like.

System 500 is illustrative of various gratings and operational modes. Other embodiments can support more, fewer, and different gratings and modes. For example, an image-change detector can support modes that employ different thresholds, framerates, integration periods, sweep rate, grating selections, etc.

Some lighting fixtures produce not a steady illumination, but a flicker, often at the frequency of the AC current powering them, or at twice this frequency. Many applications would benefit from being able to reject this flicker, yet stay sensitive to the motion or to the appearance of other types of light sources. System 500 can be made selectively blind to illumination periodicity by any of the following four means. First, a bulk photoelement (a photodiode or photovoltaic) without any angle-selective optics over it is sensitive to the overall brightness of the scene. If the integration period of each of the active pixels is not governed by time per se, but rather governed by crossing a threshold in the accumulated photocurrent incident on the bulk photoelement, then the signals observed at each active pixel is scaled by the overall brightness of the room, which will be sensitive to flicker in a way similar to the active pixels. Second, the integration period of the active pixels can be set to an integer multiple of the repetition period of the flickering illumination. Third, the integration periods for any two signals that are to be compared can commence at the same phase of the flickering illumination. Fourth, the signals from each active pixel can be pooled to arrive at an estimate of the overall brightness, and individual signals can first be normalized by this brightness before subsequent normalized frames are compared.

Figure 7A:
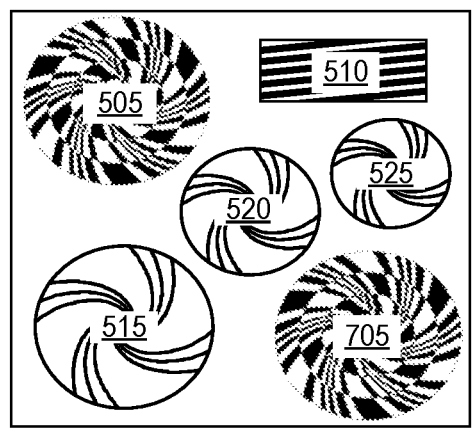
FIG. 7A is a plan view of an imaging system 700, integrated into a single sensing device, in accordance with another embodiment.

FIG. 7A is a plan view of an imaging system 700, integrated into a single sensing device, in accordance with another embodiment. System 700 is similar to system 500 of FIGS. 5A and 5B, with like-identified elements being the same or similar. System 700 differs from system 500 in that gratings 505, 510, 515, 520, and 525 are arranged to accommodate a sixth grating 705 that is identical to grating 505. Gratings 505 and 705 are placed in opposite corners to maximize their physical separation, a beneficial arrangement for binocular range measurements.

Figure 7B:
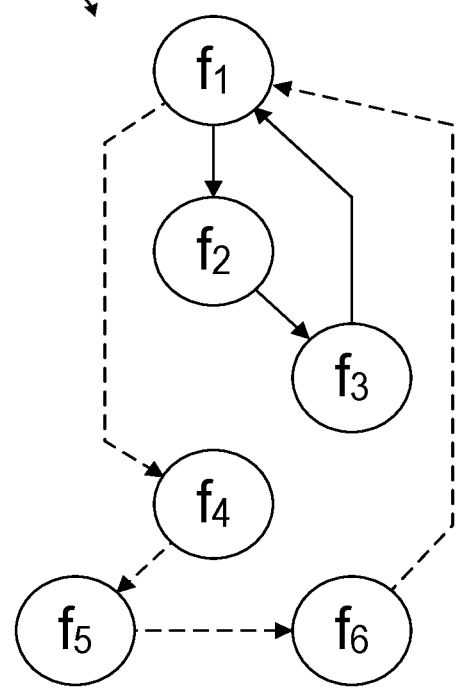
FIG. 7B is a state diagram 710 illustrating the operation of system 700 of FIG. 7A in accordance with one embodiment.

FIG. 7B is a state diagram 710 illustrating the operation of system 700 of FIG. 7A in accordance with one embodiment. The gratings are used separately in various combinations to support diverse imaging functions. This example shows six functions f1-f6, with each function representing a single state in state diagram 710. System 700 can step through sequences of states to accomplish a range of imaging tasks, such as to read barcodes, assist a vehicle or drone in obstacle avoidance, or capture images.

Each of functions f1-f6 is supported by one or more gratings and one or more processes. There are six gratings, six functions f1-f6, and nine processes p1-p9 in this example; however, the numbers of gratings, functions, and processes can vary. The six representative functions are:

Function f1: performs a low-power sentinel function for general motion and/or presence detection;
Function f2: detects the presence of barcodes;
Function f3: reads barcodes;
Function f4: a low-power sentinel function that responds to changes in binocular disparity;
Function f5: measures or monitors the range between the sensor and an imaged object; and
Function f6: captures a color image at the highest available resolution.

Each grating can be used with some or a subset of nine processes. The nine processes are:

Process p1: monitors a small number of pixels to detect motion that exceeds a threshold (akin to the sentinel stage detailed above in connection with FIGS. 6A and 6D);
Process p2: monitors a larger percentage of available pixels than in process p1 to verify motion (akin to the tentative stage detailed in connection with FIGS. 6B and 6D);
Process p3: captures high-resolution responses;
Process p4: inverts captured responses to produce images;
Process p5: detects changes in binocular disparity or looming that surpass a threshold per unit time;
Process P6: measures the spacing between system 700 and an object based on binocular disparity;
Process P7: captures low-resolution responses to detect motion below a threshold;
Process P8: detects barcodes; and
Process P9: reads barcodes.

System 700 supports multiple imaging tasks, each of which can be accomplished using one or more functions. Each function, in turn, can be accomplished by applying one or more processes to capture and analyze data from one more of the gratings. State diagram 710 illustrates two tasks, (1) power-efficient barcode reading, and (2) obstacle avoidance with image capture. The task of barcode reading employs functions f1-f3. The task of obstacle avoidance employs functions f1 and f1-f6.

FIG. 7C is a table 750 relating each grating to compatible processes. For example, grating 505 can be used with processes P1-P7, and grating 510 with processes p8 and p9. Table 750 also shows which grating or gratings and which process or processes are used for each of functions f1-f6. The gratings and processes used for a given function are highlighted using bold, italicized font. Some processes are not used with every compatible grating in these examples. For example, one or more of gratings 515, 520, and 525 can use processes p1 and p2 for e.g. color motion detection, with or without one or more of the other gratings.

The following example assumes system 700 is incorporated into a barcode scanner and configured to read barcodes. Such configuration can be e.g. hard-wired, established by loading a configuration register, or accomplishing using software executing on a general-purpose processor.

System 700 starts in state f1. With reference to table 750, this state uses grating 505 and the low-power sentinel process p1 to minimize power usage, which is particularly helpful for battery-operated devices. Following the solid arrows for this example, state diagram 710 transitions to state f2 when motion is detected. Function f2 employs grating 510 and barcode-presence-detection process p2. Grating 505 and process p7 optionally allow function F2 to exclude image data acquired in the presence of excessive motion. State diagram 710 transitions to state f3 when a barcode is detected, using grating 510 and process p9 to read the code. As before, grating 505 and process p7 are can be used to exclude image data acquired in the presence of excessive motion. With the barcode read, state diagram 710 returns to state f1.

System 700 might also be incorporated into a vehicle or drone and used for e.g. obstacle avoidance, to image closing objects, or both. In one such example, shown using dashed arrows in FIG. 7B, system 700 starts in state f1, the same state discussed above in connection with barcode scanning. State diagram 710 transitions to state f4 when motion is detected. Function f4 uses process p3 to capture successive pairs of high-resolution image-data sets from gratings 505 and 705, and then uses process p5 to detect changes in the disparity between the data sets. Such changes indicate that an object closing on system 700, or vice versa. Alternatively, or in addition to binocular disparity, looming can be sensed using a different process and image data from the same or different gratings.

Should function f4 detect a change, state diagram 710 transitions to state f5, in which case system 700 uses process p3 to capture pairs of image-data sets from gratings 505 and 705, and process p6 to and calculate the spacing between system 700 and a detected object based on the binocular disparity between the data sets in each pair. The vehicle or drone can be alerted at any point in the task to e.g. take evasive action.

In the instant example, state diagram 710 transitions to state f6 should the object distance fall below a specified threshold. In that state, system 700 uses process p3 to capture data sets from gratings 505, 515, 520, 525, and 705, and applies process p4 to invert and combine those data sets to produce a high-resolution image of the sensed object. Alternatively, the data can be stored locally or remotely and inverted later, such as when a more powerful processor is available.

Figure 8A:
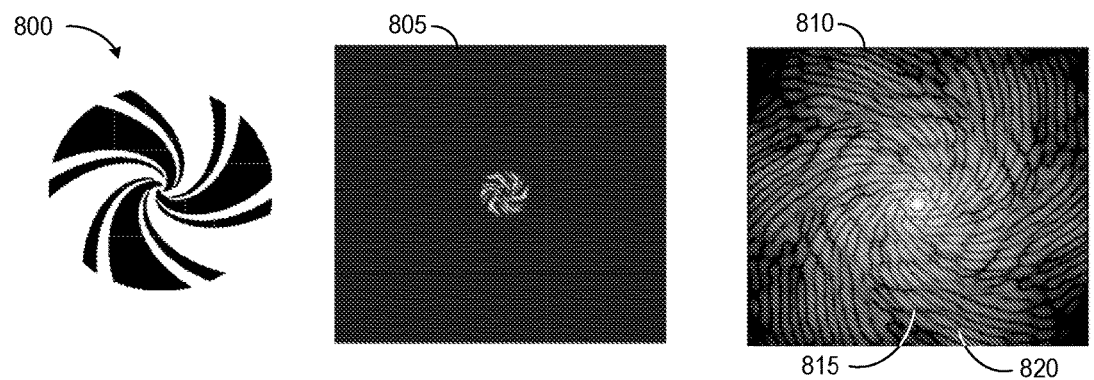
FIG. 8A depicts a plan view of a spiral phase grating 800 in accordance with another embodiment.

FIG. 8A depicts a plan view of a spiral phase grating 800 in accordance with another embodiment. FIG. 8A also includes a PSF 805 and a modulation transfer function (MTF) 810 for light incident grating 800 at an angle of zero degrees (i.e., from directly above grating 800 in FIG. 8A).

MTF 810 is the absolute value of the optical transfer function (OTT), which is in turn the Fourier transform of the impulse response of grating 800, represented here as PSF 805. The center area of MTF 810 represents DC components of PSF 805, with higher spatial frequencies representing with increasing distance from the center. MTF 810 shows that PSF 805—in combination with the underlying sensor array (not shown)—includes a rich set of information for a range of spatial frequencies and orientations. It is apparent, however, that this information is not uniformly distributed over the gamut of spatial frequencies.

Away from the center of MTF 810, the relatively bright areas indicate orientations and spatial frequencies for which grating PSF 805 has power to resolve components of a faraway scene. Conversely, dark areas show where PSF 805 lacks the power to resolve scene components. These dark areas are generally divided into circular nulls 815 and curved, radial nulls 820 that represent poorly resolved spatial frequencies. Images obtained using PSF 805 will lack detail at these weak spatial frequencies.

Figure 8B:
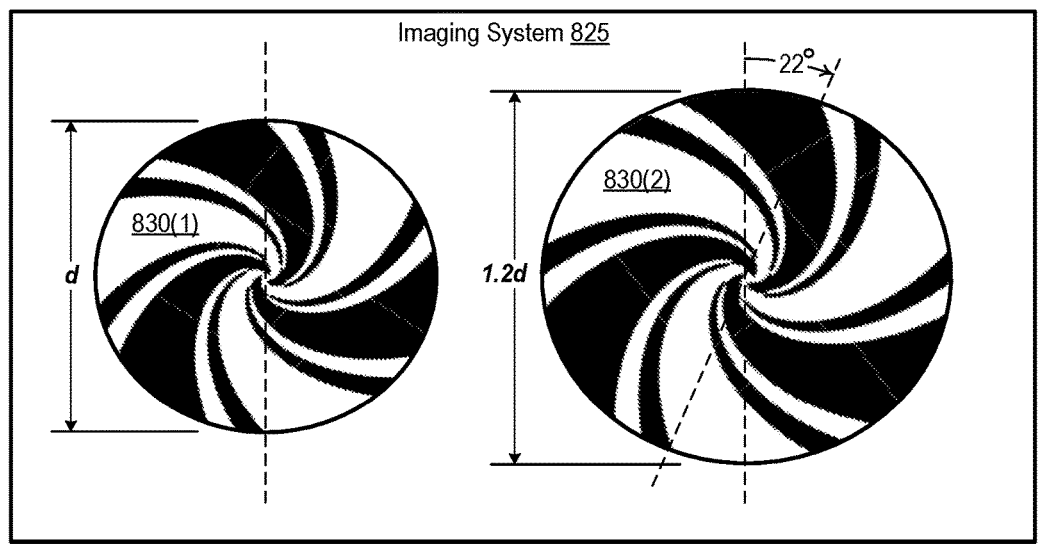
FIG. 8B depicts an imaging system 825 that counteracts the effects of circular and radial nulls 815 and 820 of FIG. 8A to produce more detailed images.

FIG. 8B depicts an imaging system 825 that counteracts the effects of circular and radial nulls 815 and 820 to produce more detailed images. System 825 includes a pair of gratings 830(1) and 830(2) each overlaying the same or separate pixel arrays (not shown). Images from gratings 830(1) and 830(2) can be entirely separate or overlapping on the underlying sensor(s). Though similar, every feature of a certain spatial scale of grating 830(2) is rotated by twenty-two degrees relative to the equivalent feature of the same scale in grating 830(1), and the diameter of grating 830(2) is made twenty percent greater than the diameter d of grating 830(1) through the process of continuing each curving arm.

Each of gratings 830(1) and 830(2), in combination with the underlying array, exhibits an MTF similar to MTF 810 of FIG. 8A. The angular offset between gratings 830(1) and 830(2) mainly addresses the curved radial nulls 820 by aligning the stronger phases (bright areas) of the MTF of grating 830(2) with the weaker phases (nulls 820) of grating 830(1). The optimal relative angle can be selected by maximizing the mean of the log powers of a joint MIT taken from both spirals. The log function can be augmented with a floor set by an expected signal-to-noise ratio (SNR), below which signal levels are essentially unusable. This embodiment employs a pair of six-arm spiral gratings 830(1) and 830(2) for which the optimal angular offset is approximately ⅜ths of the angle needed to make the PSFs of gratings 830(1) and 830(2) congruent up to the point where features of 830(1) end.

The size disparity between gratings 830(1) and 830(2) mainly addresses the paucity of spatial-frequency data due to circular nulls 815, again by aligning the stronger phases of the MTF of grating 830(2) with the weaker phases of grating 830(1). The optimal relative scale can again be selected by maximizing the mean of the log powers of a joint MTF taken from both gratings. In this example in which gratings 830(1) and 830(2) are of different orientations and sizes, both relative attributes can be adjusted to optimize whatever the desirable figure or figures of merit. Imaging devices can provide still more complete coverage using additional gratings. With larger numbers of spiral gratings, for example, more complicated combinations of relative sizes and angles can be used to improve Fourier coverage. Other grating variations, such as different lateral offsets with respect to the underlying pixel pitch or different types of photodetectors, can also improve coverage.

Figure 9A:
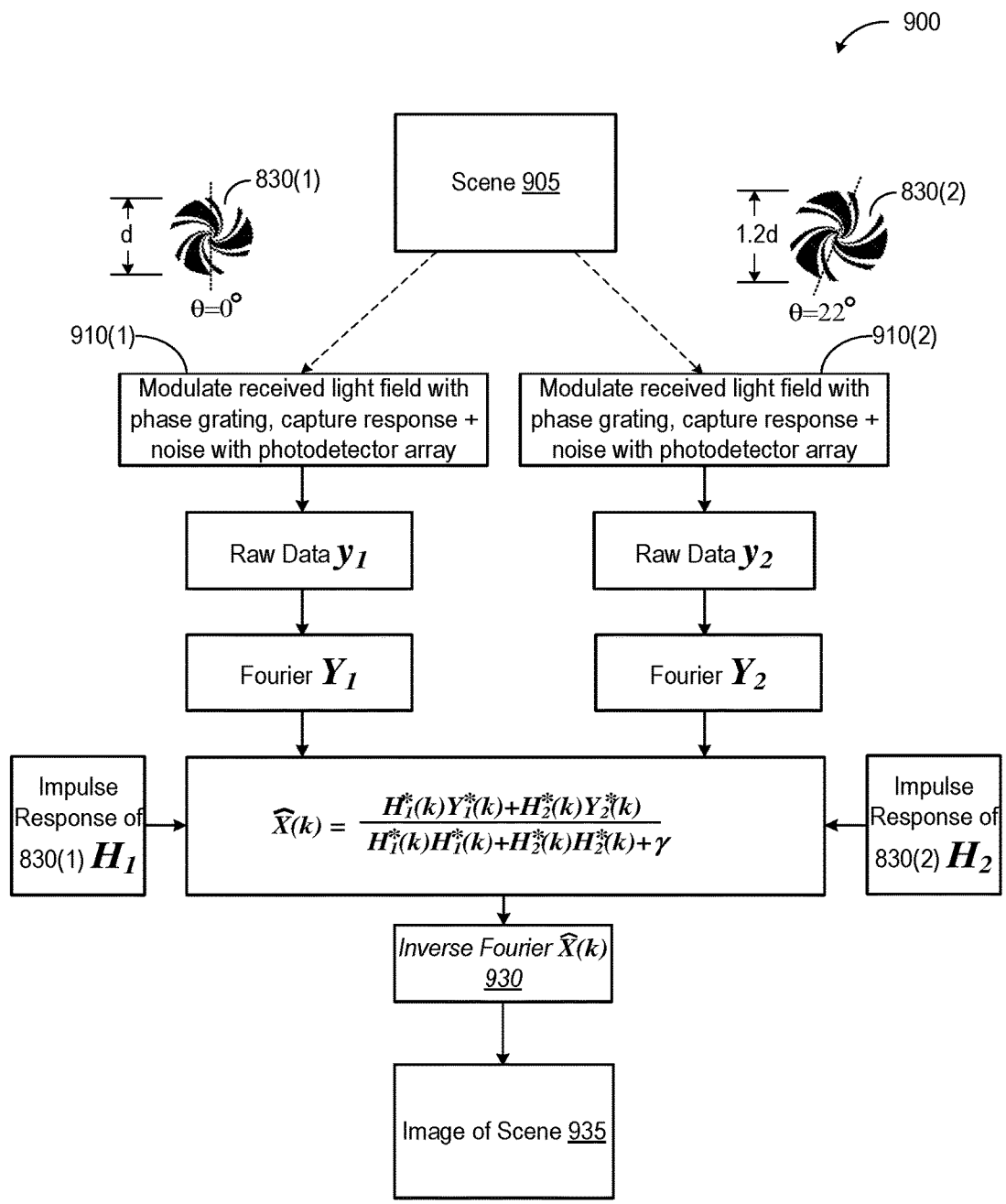
FIG. 9A is a flowchart 900 detailing how an image is captured and resolved using imaging system 825 of FIG. 8B.

FIG. 9A is a flowchart 900 detailing how an image is captured and resolved using imaging system 825 of FIG. 8B.

First, system 825 is oriented such that light from a scene 905 of interest is incident gratings 830(1) and 830(2). The incident light passes through both gratings 830(1) and 830(2), which modulate the received light (steps 910(1) and 910(2)) to produce intensity patterns for capture by an underlying photodetector array as raw data sets $y_1$ and $y_2$ that represent scene 905 in the spatial domain. If rendered as images, these data sets would be unintelligible to a human observer. However, these data sets are predictable transformations of the incident scene. Where raw data $y_1$ and $y_2$ are captured using the same sensor array, the frame or frames from the array are separated into the regions on the array that correspond to gratings 830(1) and 830(2), with each region of pixels treated as a separate sensor.

Raw data sets $y_1$ and $y_2$ are each subject to a Fourier Transform, which decomposes those data sets into respective transforms $Y_1$ and $Y_2$ that represent scene 905 in the Fourier or frequency domain. The PSFs are known for respective gratings 830(1) and 830(2), possibly in combination with the underlying array, from a prior calibration or high-fidelity simulation. The known impulse responses for gratings 830(1) and 830(2) can take into account the way in which each PSF varies as a function of e.g. incident angle and color.

Fourier transforms $H_1$ and $H_2$ of the impulse responses are applied to respective transforms $Y_1$ and $Y_2$. Rather than using a standard reconstruction kernel on each region of pixels under each spiral, the following formula can be used to make a joint estimate $\hat{X}$ of each spatial frequency k in the image based on two Fourier-transformed pixel readings $Y_1$ and $Y_2$ and the Fourier transforms of the corresponding impulse responses $H_1$ and $H_2$:

$$\hat{X}(k) = \frac{H_1^*(k)Y_1(k) + H_2^*(k)Y_2(k)}{H_1^*(k)H_1(k) + H_2^*(k)H_2(k) + \gamma} \quad (1)$$

Equation (1) takes a weighted average of the Fourier-domain estimate obtained from each pixel reading area, where the weight is inversely proportional to the expected variance assuming noise is spectrally white and uniform. A regularization factor $\gamma>0$ based on the noise level under the current illumination conditions is included in the denominator to ensure frequency-domain estimate $\hat{X}$ is invertible. This process can be extended to using more than two distinct gratings by simply accumulating additional H terms in both the numerator and denominator. An inverse Fourier transform (step 930) inverts joint estimate $\hat{X}$ to obtain an image 935 of scene 905.

Figure 9B:
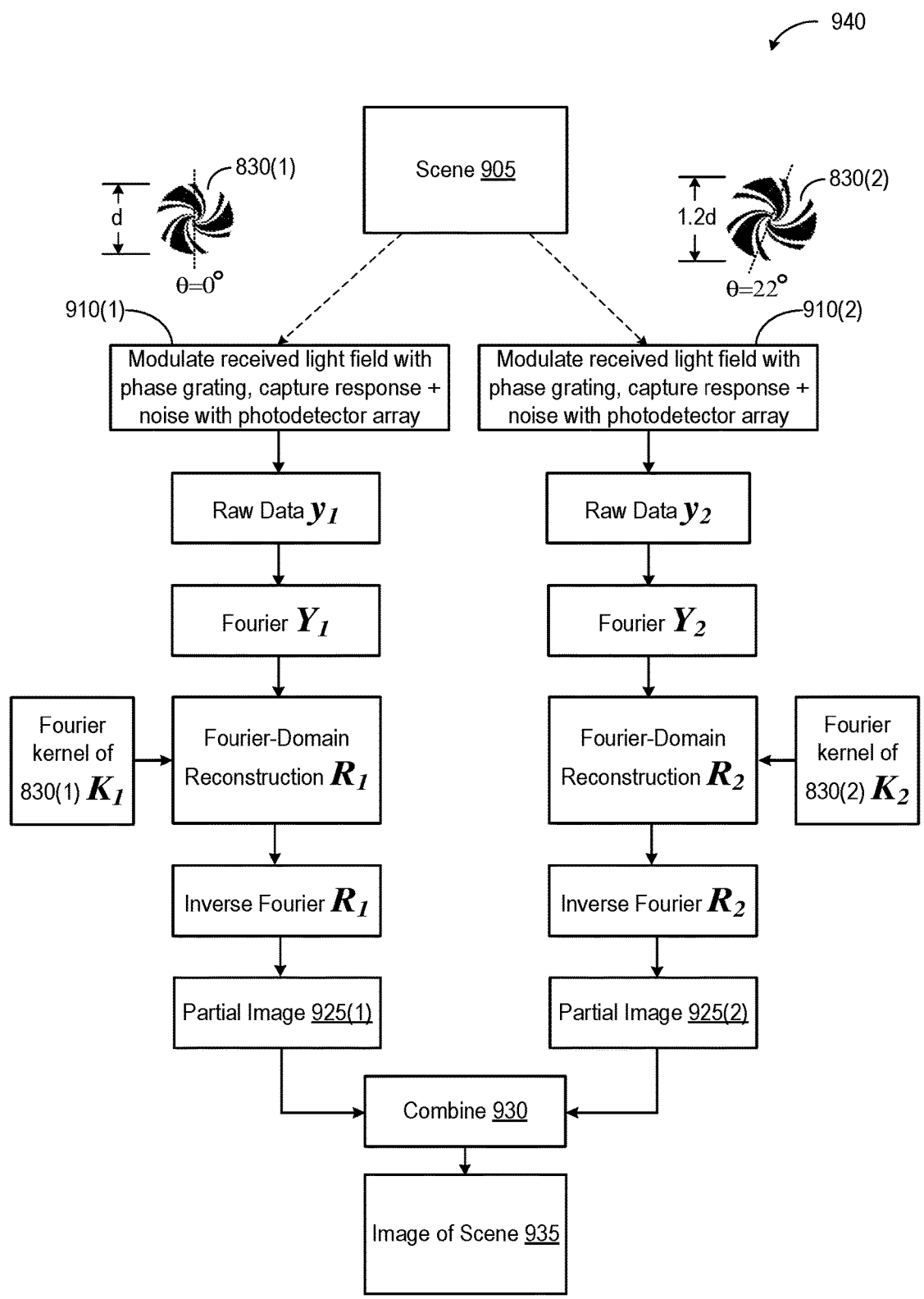
FIG. 9B is a flowchart 940 detailing how an image is captured and resolved using imaging system 825 of FIG. 8B using an alternative processing sequence.

FIG. 9B is a flowchart 940 detailing how an image is captured and resolved using imaging system 825 of FIG. 8B using an alternative processing sequence that is similar to the one detailed above in connection with FIG. 9A through the acquisition of transforms $Y_1$ and $Y_2$ that represent scene 905 in the Fourier domain. Individual kernels $K_1$ and $K_2$ are constructed for each spiral of the form:

$$K_n(k) = \frac{H_n^*(k)}{\Sigma_i H_i^*(k) H_i(k) + \gamma} \quad (2)$$

Kernels $K_1$ and $K_2$ are used to obtain respective Fourier-domain reconstructions $R_1$ and $R_2$ for gratings 830(1) and 830(2), which are then inverted to obtain partial images 925(1) and 925(2).

Once obtained, partial images 925(1) and 925(2) can be combined (step 930) to form image 935 in a manner that favors whichever set of raw data $y_1$ and $y_2$ contains the best information for representing different image properties. Different spirals may be above distinct areas of a photodiode array that may exhibit distinct angle-specific gain, have different edge effects, or have regional known-bad patches of pixels. In any of these cases, reconstructing multiple times with equation (5) gives the opportunity to apply an angle-dependent weighting of the reconstructions before they are reassembled.

Final image 935 can be created by adding partial images 925(1) and 925(2) together and scaling them for display. The brightest regions of each partial image thus assert their influence on final image 935 while providing noise reduction in the portions of the scene where both gratings produce similar results. Combining partial images 925(1) and 925(2) in this also prevents a sharp transition from one grating to the other in final image 935. Rather than combining partial images, some imaging tasks may be accomplished by selecting between partial images 925(1) and 925(2). In such instances the data from one of gratings 830(1) and 830(2) can be ignored to save power, or the selection of one partial image can be based upon an analysis of the images.

Figure 9C:
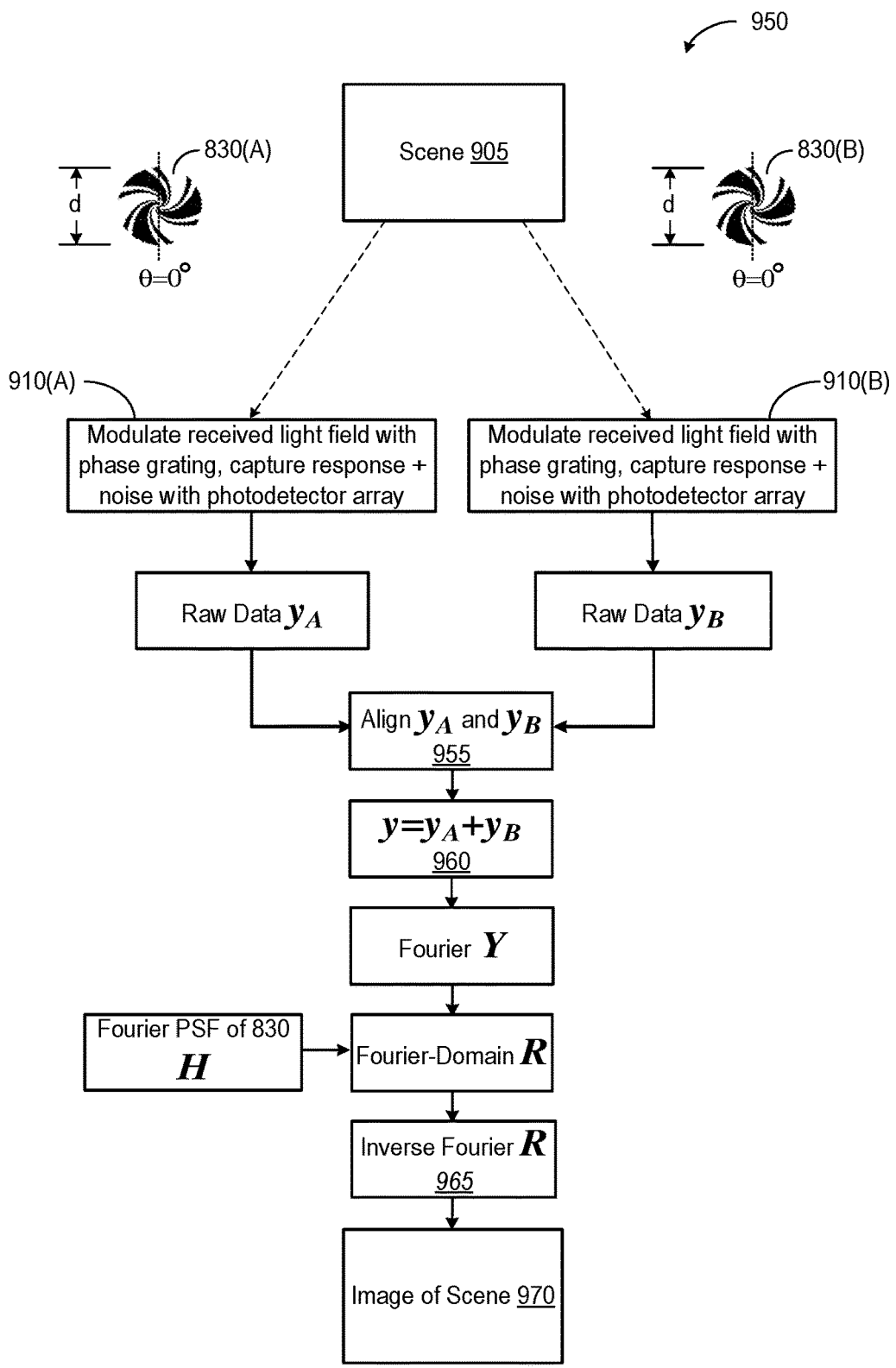
FIG. 9C is a flowchart 950 detailing how an image is captured and resolved using an imaging system similar to imaging system 825 of FIG. 8B but with two identical gratings 830(A) and 830(B).

FIG. 9C is a flowchart 950 detailing how an image is captured and resolved using an imaging system similar to imaging system 825 of FIG. 8B but with two identical instances of grating 830, here labeled 830(A) and 830(B). These two gratings, in combination with their underlying pixels, exhibit the same impulse response. Raw data sets $y_A$ and $y_B$ obtained from the same scene 905 doubles the amount of light collected, and consequently improves light sensitivity.

Gratings 830(A) and 830(B) are physically separate, so raw data sets $y_A$ and $y_B$ are misaligned in proportion to the grating separation and the distance to objects in the scene. Raw data sets $y_A$ and $y_B$ can be aligned (step 955), and the extent of misalignment can be used to calculate distances. The aligned data sets $y_A$ and $y_B$ can then be summed (step 960) and the combined image data subjected to a Fourier transform to obtain a Fourier image transform Y. A Fourier transform H of the PSF or impulse response common to gratings 830(A) and 830(B) is then used to construct a Fourier-domain image R of scene 905, which can then be inverted to produce a pixel-domain image 970 of scene 905.

Many gratings can be disposed over a single array of pixels to improve light sensitivity. Gratings of different shapes of gratings can be tessellated to cover the pixel array, in which case an imaging device could be divided into regions having equivalent point-spread functions, possibly a great many such regions, with each region of pixels collecting a respective set of raw data. Suitable tessellated gratings are detailed in U.S. Patent Publication 2015-0061065 to Patrick R. Gill and David G. Stork.

Figure 10A:
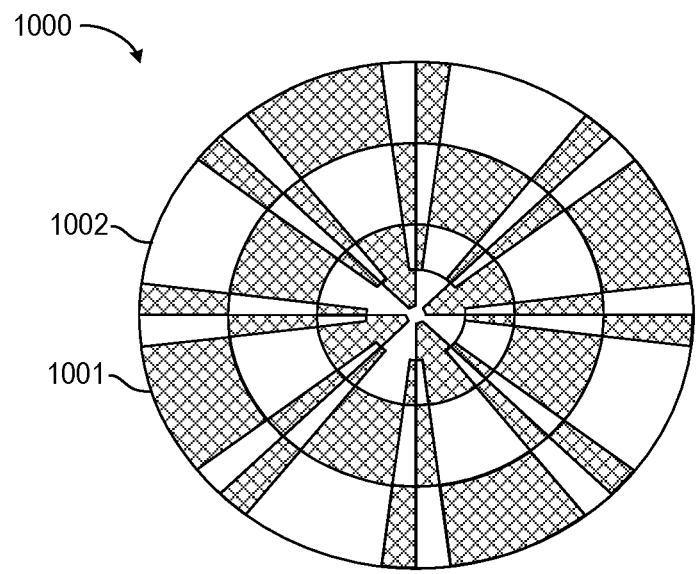
FIG. 10A is a plan view of a phase grating 1000 in accordance with another embodiment.

FIG. 10A is a plan view of a phase grating 1000 in accordance with another embodiment. As with prior examples, feature spacing increases along odd-symmetry boundaries (between elevated regions 1001 and recessed grating regions 1002, represented by dark and light) with distance from the center. Phase-reversing boundaries between concentric circles perturb otherwise smooth, relatively linear features. Different spacings could be optimal for different wavelengths and sensor-grating spacings, and the zones could take other forms. Collections of similar gratings with different scales and angular offsets could be used as detailed previously. For example, the concentric circular zone boundaries could be scaled differently in two or more such gratings, similar gratings could be rotated relative to one another, or a collection of such gratings could combine both scaling differences and rotational offsets.

Figure 10B:
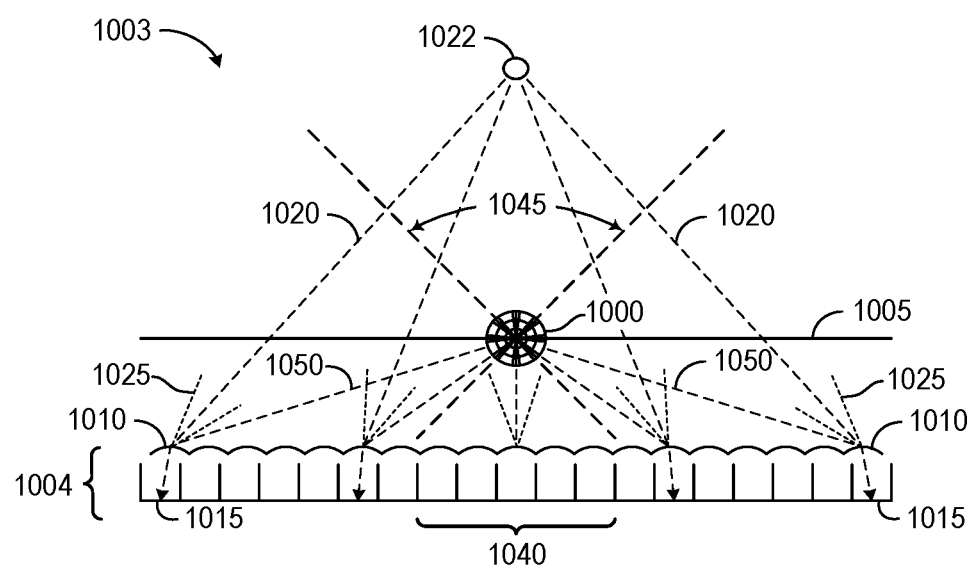
FIG. 10B depicts an imaging system 1003 in which a CMOS image sensor 1004 is combined with grating 1000 of the type detailed in connection with FIG. 10A.

FIG. 10B depicts an imaging system 1003 in which a CMOS image sensor 1004 is combined with grating 1000 of the type detailed in connection with FIG. 10A. Grating 1000 allows light through an aperture in an otherwise opaque aperture layer 1005. Grating 1000 is shown in plan view for illustrative purposes, but would appear from the side and in cross section in a cut-away view.

Image sensor 1004 is equipped with an array of microlenses 1010 that focuses incident light on an array of pixels 1015, one microlens per pixel. Pixels 1015 are most sensitive to light arriving in a particular direction (usually perpendicular to the surface) and/or in a particular portion of the pixel's area. Front-side illuminated pixels are most demanding in both respects, as incoming light must avoid being blocked by layers of metal wires above a photosensitive area that is effectively at the bottom of a deep canyon with steep walls. Microlenses 1010 address this problem by focusing and directing incoming light rays 1020 from the location of an exit pupil 1022 of an assumed lens onto the photosensitive areas. In particular, microlenses 1010 are placed relative to their respective pixels 1015 so that light rays coming from the assumed exit pupil 1022 are bent by each microlens 1010 to intersect the underlying pixel 1015 in the most advantageous position and direction. Due to microlens placement, pixels 1015 near the center of sensor 1004 are most sensitive to light traveling perpendicular to the sensor surface, with pixels 1015 farther from the center growing progressively more sensitive to light approaching at shallower angles. One can imagine that the combination of each pixel 1015 and its associated microlens 1010 has a cone 1025 of light ray directions to which is it most sensitive. In the center of sensor 1004, the axis of the cone 1025 is pointing straight up. Cones 1025 tip inwards as a function of their displacement from center to maintain sensitivity to light from exit pupil 1022. By drawing light from the light-insensitive regions between pixels, microlenses both improve sensitivity and reduce cross talk. The effect of this focusing grows with reduced pixel pitch because the percentage of light-sensitive pixel area is reduced.

Grating 1000 is mounted much closer to image sensor 1004 than the expected exit pupil 1022 would be, with the single centered grating 1000 falling within the fraction of cones 1025 near the center of image sensor 1004. Pixels 1015 outside this area 1040 will have very low sensitivity (and thus low signal-to-noise ratio) for light passing through grating 1000. This results in a usable field of view 1045 that is narrow relative to the intrinsic capabilities of grating 1000. For example, the outermost rays 1050 from grating 1000 do not fall within the sensitive cone 1025 of the outermost pixels 1015. The focusing functions of the microlenses may be misaligned by e.g. a full pixel pitch for light entering the microlens array at a very steep angle.

If grating 1000 is offset from the center of image sensor 1004, the set of pixels 1015 that are sensitive to rays from grating 1000 is offset even more. Assuming grating 1000 were offset from the center of image sensor 1004 to the left, for example, sensitive area 1040 would likewise be displaced to the left, and the portion of the scene imaged by area 1040 displaced to the right. Identical gratings placed over different areas of image sensor 1004 thus exhibit distinct impulse responses and distinct usable fields of view.

Figure 10C:
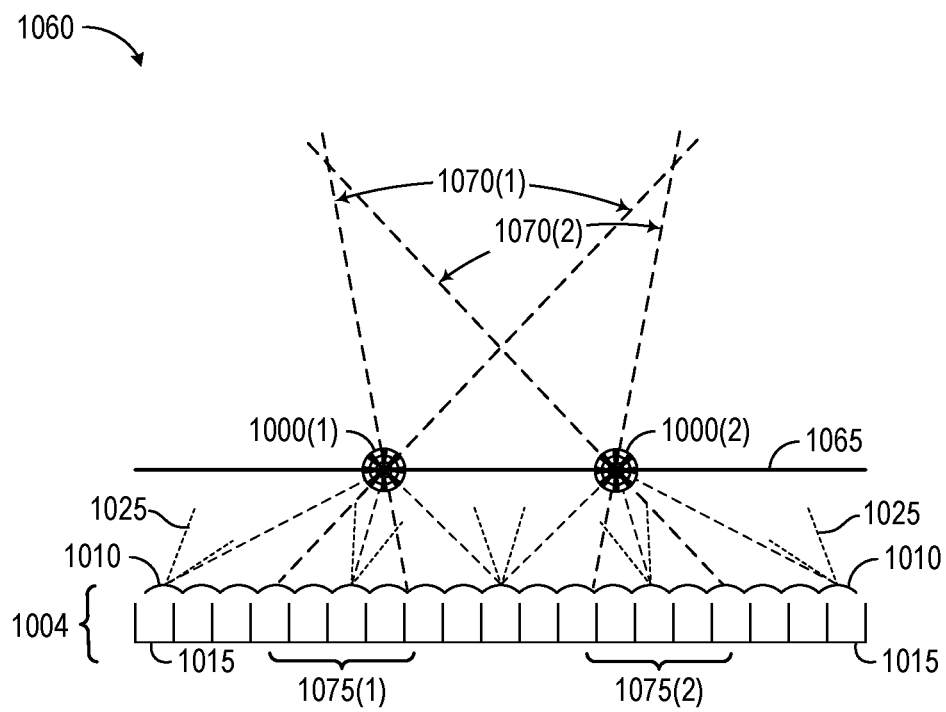

FIG. 10C depicts an imaging system 1060 in which a pair of identical gratings 1000(1) and 1000(2) are disposed in an aperture layer 1065 over image sensor 1004 of FIG. 10B, with like-identified elements being the same or similar. Gratings 1000(1) and 1000(2) exhibit the same PSFs, but have different fields of view 1070(1) and 1070(2) and exhibit different regions 1075(1) and 1075(2) of highest sensitivity because they are in different positions over image sensor 1004. Intensity data sampled from regions 1075(1) and 1075(2) can be combined to image a larger part of the external scene than could be imaged with equivalent performance by a single aperture.

The microlenses in regions 1075(1) and 1075(2) are aligned differently relative to the pixels and gratings, and so exhibit different collective microlens responses. The impulse responses associated with image data collected via gratings 1000(1) and 1000(2) are therefore different despite their identical PSFs. Where significant differences exist between the impulse responses of the gratings, the methods detailed in connection with FIGS. 9A and 9B can accommodate these disparities such that the stronger of the impulse responses of gratings 1000(1) and 1000(2) for a given pixel can be favored for image acquisition.

The array of microlenses 1010 can be optimized for use with multiple gratings. For example, each grating aperture can be placed over a patch of pixels with cones of sensitivity aligned with the corresponding aperture. Such a configuration would result in the same portion of the scene imaged almost identically by the different gratings, allowing very high quality image reconstruction over a field of view that is narrower than for system 1060 of FIG. 10C, but wider than for system 1003 of FIG. 10B.

Alternatively, and if economies of scale permit, image sensors with or without microlenses can be tailored for use with one or more gratings. Some embodiments may use a back-illuminated sensor, in which case the pixel wiring is located on the side opposite gratings 1000(1) and 1000(2). This configuration ameliorates the aforementioned alignment issues associated with front-illuminated sensors. The array of microlenses 1010 is omitted or removed in other embodiments.

Figure 11:
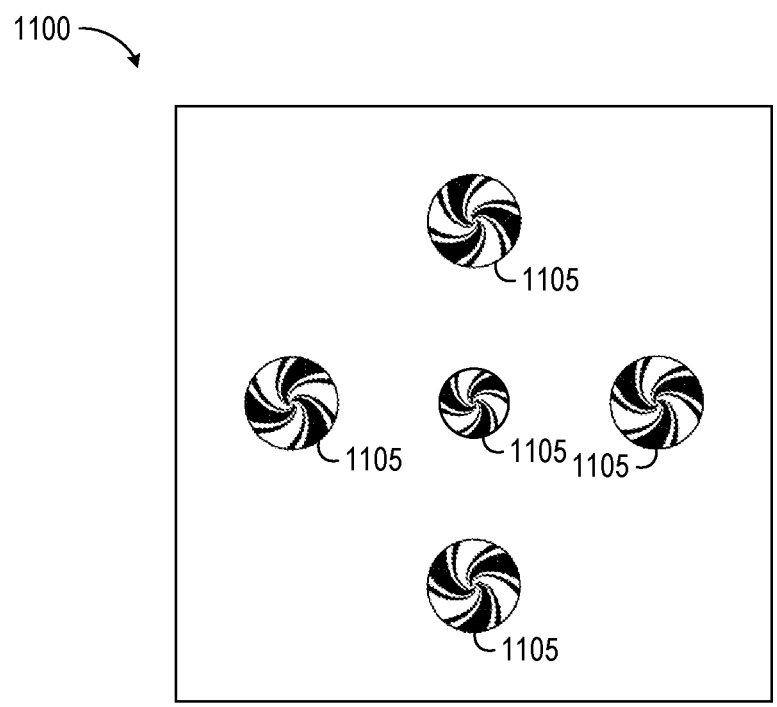
FIG. 11 depicts an imaging system 1100 with a variety of similar gratings 1105 of different areas and orientations

FIG. 11 depicts an imaging system 1100 with a variety of similar gratings 1105 of different areas and orientations. The optimal spiral for capturing information from high incident angles may have larger features than those optimal for paraxial incident light. Thus, it may be preferable to arrange multiple spirals comprising a diversity of aperture sizes in a configuration such that the smaller spirals overlie pixels more sensitive to paraxial light, while larger spirals overlie pixels more sensitive to light incident at higher angles.

The multiple gratings need not be physically separate as shown in the foregoing examples. The techniques detailed herein can be applied to tessellated gratings, examples of which are detailed in U.S. patent publication 2015/0061065 to Patrick R. Gill and David G. Stork entitled "Optical Sensing of Nearby Scenes with Tessellated Phase Anti-Symmetric Gratings," which is incorporated herein by reference.

Figure 12A:
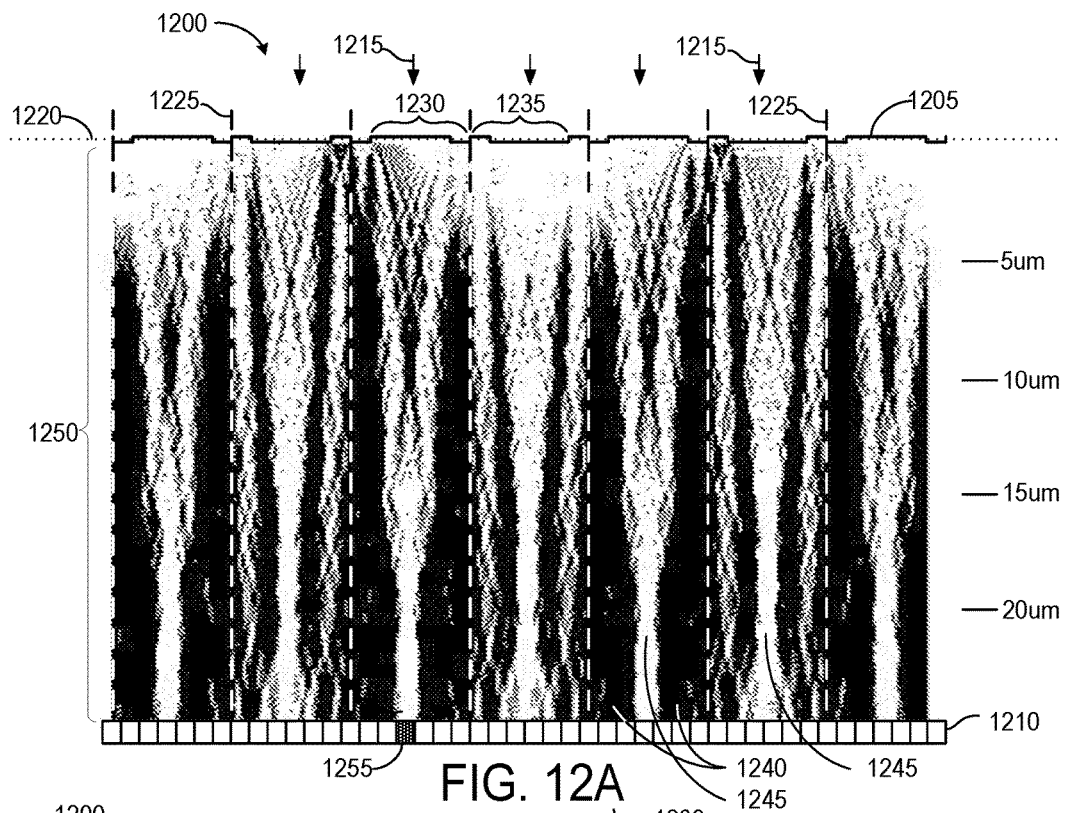
FIG. 12A is a cut-away view of an imaging device 1200 that supports computational diffractive imaging.

FIG. 12A is a cut-away view of an imaging device 1200 that supports computational diffractive imaging. Device 1200 includes a phase antisymmetric grating 1205 overlying a photodetector array 1210, such as a CCD (charge-coupled device), CMOS (complementary metal-oxide-semiconductor) or (in the case of thermal IR detection) a microbolometer sensor. The photodetector array may comprise a lenslet array designed to concentrate incident photons onto the most sensitive areas of the array to increase quantum efficiency. The features of grating 1205 offer considerable insensitivity to the wavelength of incident light in a wavelength band of interest, and also to the manufactured distance between grating 1205 and photodetector array 1210. Grating 1205 produces an interference pattern for capture by array 1210. Digital photographs and other image information can then be extracted from the pattern.

Imaging device 1200 does not require a lens, and so can be extremely small and inexpensive. Captured interference patterns are unintelligible to a human observer, but the captured data includes sufficient information to allow the image or aspects of the image to be computed. As detailed below, computational diffractive imagers of this type can be tailored to extract application-specific information or compute decisions (rather than compute an image) based on the optical signal. Both the phase grating and the computational functions can be optimized for the information in the visual field and the task at hand.

In FIG. 12A, light in a wavelength band of interest is depicted as striking grating 1205 from a direction 1215 that is normal to a transverse plane 1220 of the grating 1205. The wavelength band of interest can be the visible spectrum. Cameras developed for use in different applications can have different bands of interest.

Dashed lines 1225 highlight periodic boundaries between regions of phase antisymmetry. Each of these boundaries is a result of features 1230 and 1235 of odd symmetry, and produces a normally arranged curtain 1240 of minimum intensity created by destructive phase interference between adjacent features 1230 and 1235. Curtains 1240 are separated by foci 1245 (curtains of maximum light intensity), and the collection of curtains 1240 and foci 1245 extend from grating 1205 through the body 1250 of device 1200 to produce an interference pattern on photodetector array 1210. In this illustration, the pattern of intensity variations evident in foci 1245 and curtains 1240 are near-field spatial modulations that result from near-field diffraction. One photosensitive element 1255 within array 1210 is shaded beneath a focus 1245 to serve as a reference for a subsequent discussion of the angle sensitivity of device 1200.

The image of FIG. 12A resulted from a simulation of an imaging device with the following parameters and assuming specific parameters. Body 1250 is of fused silica, and is in contact with a conventional photodetector array 1210 with photosensitive elements spaced by 2.2 µm. The top of grating 1205 is an air interface in this example. The relatively small segments of features 1230 and 1235 are about 1 µm, and the relatively larger segments are about 4 µm. These segments generally form transverse plane 1220, which is separated from array 1210 by about 25 µm. Curtains 1240 and foci 1245 are the destructive and constructive interference patterns for 532 nm incident light.

The thickness of body 1250 and lengths of the segments of features 1230 and 1235 were optimized for 400 nm light despite the selection of 532 nm light for the simulation. As a consequence, the tightest focus occurs about 5 µm above array 1210 (at the 20 µm mark), or a depth of about forty times the wavelength of incident light used for the simulation. The resultant curtains 1240 plainly separate foci 1245 well above and below the 20 µm mark, however, illustrating a robust insensitivity to wavelength within the band of interest. Curtains 1240 are easily distinguished at depths beyond about 10 µm in this example, or about twenty times the wavelength of incident light used in the simulation. The relatively deep and continuous penetration of curtains 1240 also provides considerable manufacturing tolerance for the thickness of body 1250. These advantages obtain because the near-field spatial modulations projected onto array 1210 are substantially wavelength independent over the wavelength band of interest, which means that the adjacent modulations (dark and light) do not reverse signs with changes in wavelength within the band of interest.

Figure 12B:
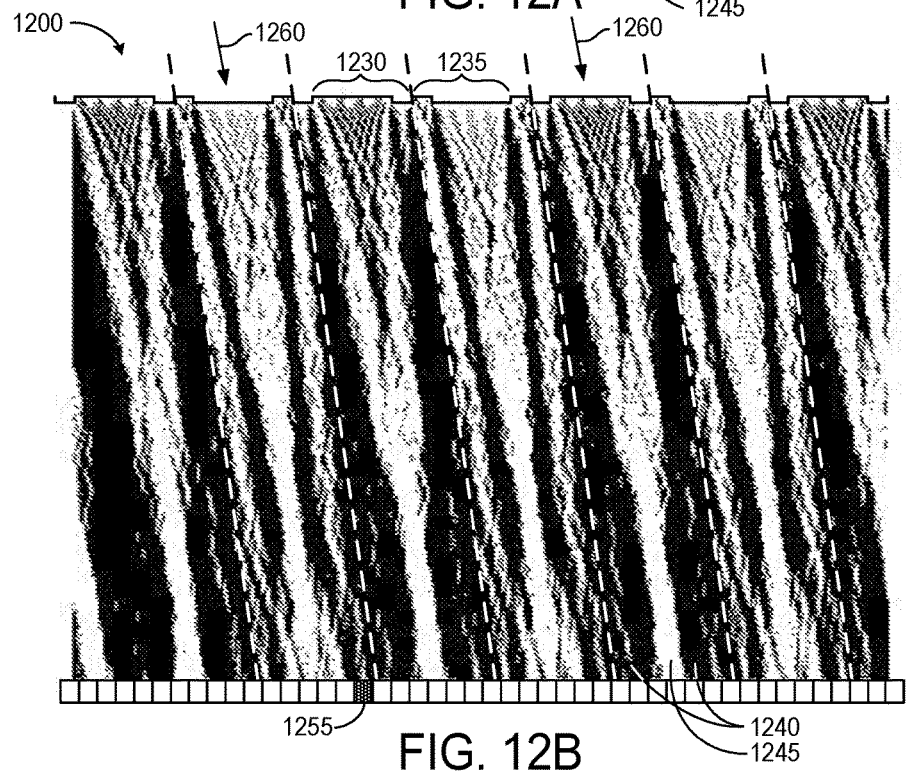
FIG. 12B depicts imaging device 1200 of FIG. 12A simulating light incident plane 1220 at an acute angle 1260 to illustrate the sensitivity of curtains 1240 and foci 1245 to the angle of incidence.

FIG. 12B depicts imaging device 1200 of FIG. 12A simulating light incident plane 1220 at an acute angle 1260 to illustrate the sensitivity of curtains 1240 and foci 1245 to the angle of incidence. Using element 1255 as a reference point, we see that that the foci 1245 that illuminated element 1255 in FIG. 12A have considerably moved to the right in FIG. 12B. Curtains 1240 and foci 1245 extend at an acute angle that relates to angle 1260 according to Snell's law. The separation of foci 1245 by curtains 1240 is maintained. Imaging device 1200 is thus sensitive to the angle of incidence.

Each phase antisymmetric structure generates a PSR, and the resultant collection of patterns is itself a PSR. As used herein, a "diffraction-pattern generator" is a structure that produces PSRs for light within the wavelength band of interest, and for a range of orientations of interest. In this one-dimensional example, the orientation of interest is perpendicular to the boundaries of odd symmetry.

Figure 13:
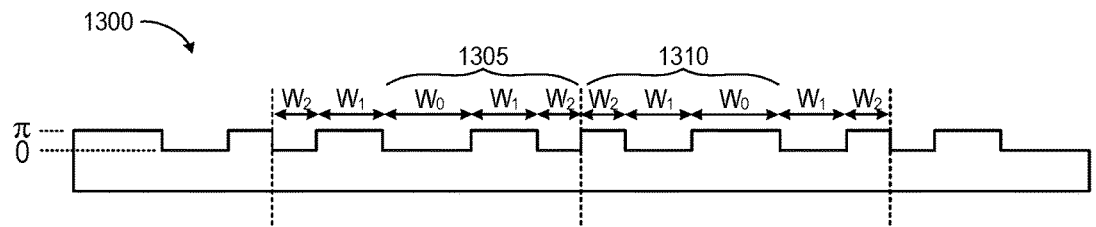
FIG. 13 depicts a one-dimensional, binary, phase-antisymmetric grating 1300 in accordance with one embodiment.

FIG. 13 depicts a one-dimensional, binary, phase-antisymmetric grating 1300 in accordance with one embodiment. The upper features of grating 1300 are at a height $\lambda/(2(n-1))$, sufficient to induce one-half wavelength of retardation in the band of interest relative to lower features, or $\pi$ radians of relative phase delay. Features 1305 and 1310 on either side of each boundary exhibit odd symmetry with three differently sized segments $W_0$, $W_1$, and $W_2$. With this arrangement, paired segments (e.g., $W_0$ within features 1305 and 1310) induce respective phase delays that differ by approximately half a wavelength over the wavelength band of interest.

Figure 14:
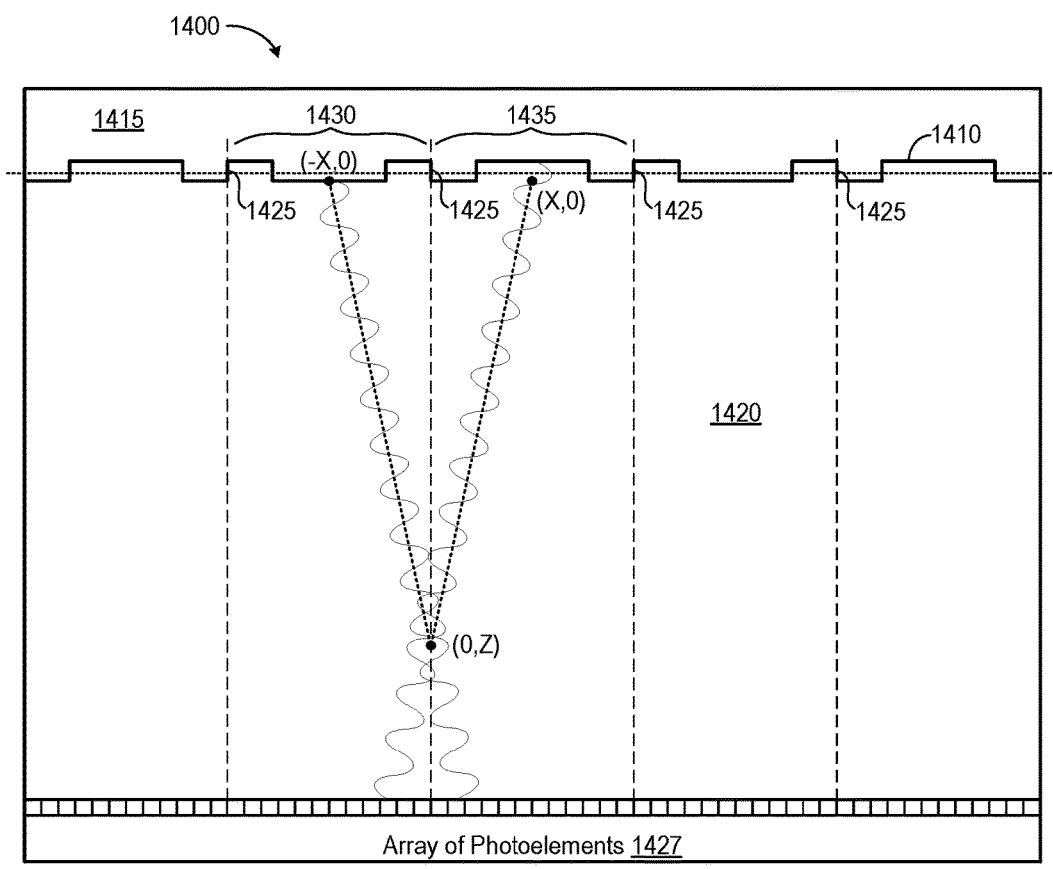
FIG. 14 depicts an imaging device 1400 in accordance with an embodiment in which a binary, phase-antisymmetric grating 1410 is formed by an interface between light-transmissive media of different refractive indices.

FIG. 14 depicts an imaging device 1400 in accordance with an embodiment in which a binary, phase-antisymmetric grating 1410 is formed by an interface between light-transmissive media of different refractive indices, a polycarbonate layer 1415 and optical Lanthanum dense flint glass 1420 in this example. Each of four boundaries of odd symmetry 1425 is indicated using a vertical, dashed line. As in the foregoing examples, the upper features of grating 1410 induce phase retardations of half of one wavelength ($\pi$ radians) relative to lower features. Features 1430 and 1435 on either side of each boundary exhibit odd symmetry.

Due to dispersion, the difference in the refractive index of polycarbonate layer 1415 and Lanthanum dense flint glass layer 1420 is an increasing function of wavelength, facilitating a wider wavelength band of interest over which the phase delay is approximately $\pi$ radians. These elements produce an interference pattern on an analyzer layer 1427 (e.g., a conventional photodiode array) in the manner detailed in connection with FIGS. 1A and 1B.

This example assumes light incident the light interface of device 1400 is normal to the transverse plane of phase grating 1410, in which case light fields that enter grating 1410 equidistant from a one of the boundaries of odd symmetry 1425, such as at locations (−X,0) and (X,0), are out of phase at points beneath grating 1410 (e.g., point (0,Z)), and thus destructively interfere to produce curtains of minimum intensity (e.g., curtains 1240 of FIG. 12A). Neither the depth Z nor the wavelength of light over a substantial spectrum significantly influences this destructive interference. Constructive interference similarly produces foci of maximum intensity (e.g., foci 1245 of FIG. 12A). Both the high and low features admit light, which provides relatively high quantum efficiency relative to gratings that selectively block light.

The following discussion details phase gratings in accordance with examples described in P. R. Gill and D. G. Stork, "Lensless Ultra-Miniature Imagers Using Odd-Symmetry Spiral Phase Gratings," in Imaging and Applied Optics, J. Christou and D. Miller, eds., OSA Technical Digest (online) (Optical Society of America, 2013). In that article, Gill and Stork describe a phase grating formed by a high-n, low-dispersion substrate and a low-n, high-dispersion coating that can introduce approximately λ-independent phase shifts in all normally incident visible light. Similar gratings are discussed above. If there exist certain points p on this interface that satisfy the following symmetry in their transmission t (•) and phase retardation φ(•), $$t(p+y)=t(p-y)\forall y \quad (3)$$

$$\phi(p+y)=\phi(p-y)+\pi+2n\pi \forall y,\ n\in\{0,\pm 1,\pm 2,\ldots\} \quad (4)$$

where y is a horizontal translation transverse to the grating direction, then the grating has phase antisymmetry about points p, and light will interfere destructively below p, regardless of λ and depth z.

A linear phase antisymmetric grating above a photosensor array could pass information from a single spatial orientation of features in the far field (transverse to the grating orientation). However, to capture information about arbitrarily oriented features of a complex scene, it is preferable to have a complete distribution of orientations in the diffractive optic. More generally, if the impulse responses are approximately spatially invariant, the transfer function of the imager approximates convolution with the impulse response. In such a case, the impulse response should have significant power at all 2D spatial frequencies to make the inversion problem of image recovery well-conditioned.

In one example provided in Gill and Stork, gratings were numerically optimized to focus visible light onto a photodetector array 100 μm below. Optical simulations estimated the imaging performance of such a device from a 60×60 pixel array with 2.2 μm pitch 100 μm below the gratings with the sensor illuminated by a complex scene far (» 100 μm) from the sensor. The resultant photocurrent from the pixel array was unintelligible when digitized and viewed directly as a digital image; however, the scene was reconstructed to a higher resolution than possible using a much larger PFCA using Tikhonov regularization. Gill and Stork report that compressed sensing techniques could be applied to improve the reconstruction quality if the scene is known to have a compressible structure. Compressed sensing could be especially advantageous if small gaps in the Fourier transform of the PSR exist.

Figure 15A:
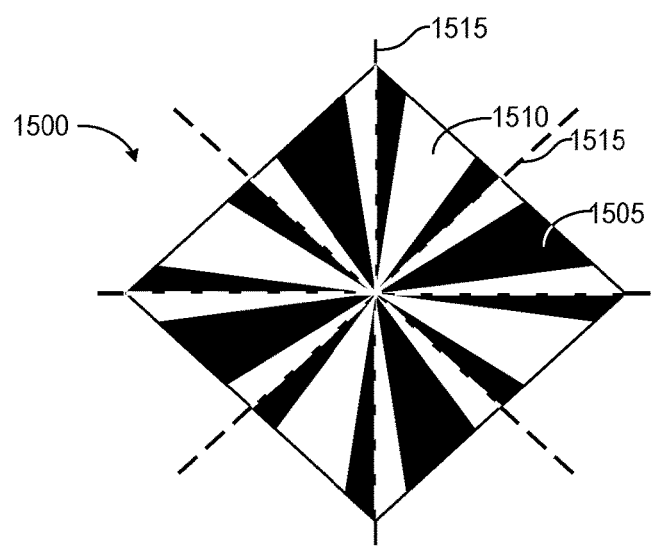
FIG. 15A is a plan view of a sensor 1500 in accordance with another embodiment.

FIG. 15A is a plan view of a sensor 1500 in accordance with another embodiment. Relatively high segments 1505 and low segments 1510 on either side of each of eight boundaries of odd symmetry 1515 create a grating in which the widths of the segments increase with distance from the center of the sensor. For a given focal depth, light of higher frequencies tends to produce a sharper focus with narrower feature widths. Sensor 1500 can therefore be optimized such that the central portion of the grating is optimized for collection of relatively higher frequency light, and the peripheral area for collection of relatively lower frequency light.

Figure 15B:
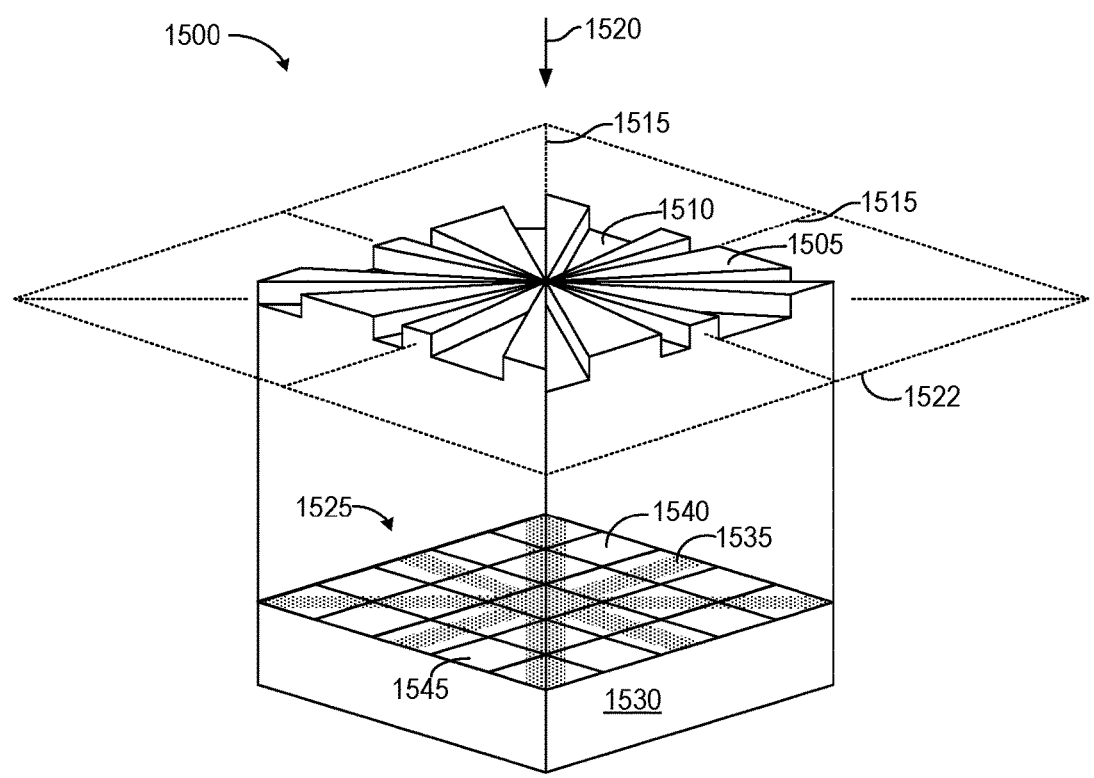
FIG. 15B is a three-dimensional perspective of sensor 1500 of FIG. 15A.

FIG. 15B is a three-dimensional perspective of sensor 1500 of FIG. 15A, and shows how light 1520 from a direction normal to a plane 1522 of the grating surface casts an interference pattern 1525, a response representative of the PSF of sensor 1500, on an underlying photodiode array 1530. Curtains and foci, as detailed previously, respectively cast shadows 1535 and bright shapes 1540 to be sensed by individual photosensitive elements 1545 of array 1530. Array 1530 captures a digital representation of pattern 1525.

Figure 16:
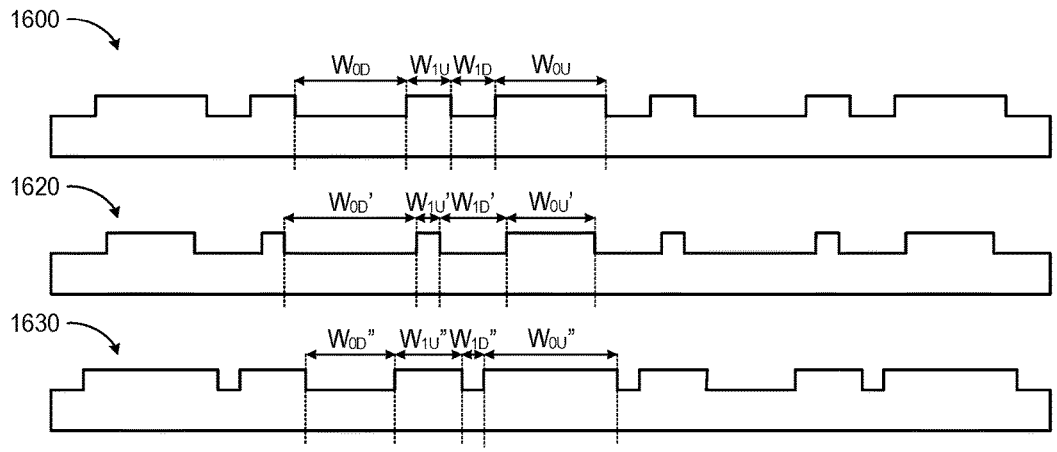
FIG. 16 depicts three odd-symmetry gratings 1600, 1620, and 1630, each with feature segments of different relative widths.

FIG. 16 depicts three odd-symmetry gratings 1600, 1620, and 1630, each with feature segments of different relative widths. It can be useful to create a sensor with multiple width ratios, as shown, to compensate for manufacturing tolerances that impact the relative heights of the grating features. Assuming, for example, that grating 1600 is width optimized for a manufacturing process of interest, but that the process produces a relative phase delay of 40% rather than the ideal 50% to form curtains of minimum intensity at the desired positions. To a first order the increased width of the relatively wide segments, as depicted in grating 1630, can improve the distortion resulting from the erroneous phase offset. Phase offsets above 50% can be corrected for by narrowing the relatively wide segments, as depicted in grating 1620. Some embodiments include a mixture of relative segment widths covering different areas of a photodiode array to accommodate manufacturing tolerances. Images associated with the gratings that provide the sharpest focus, or the sharpest focus for a wavelength of range of wavelengths, can be selected or combined to obtain the desired image data. The different gratings may also perform better for light of different wavelengths or incident angles, so the selection of which grating(s) to use for a given image may be optimized for variables other than manufacturing tolerances.

Figure 17:
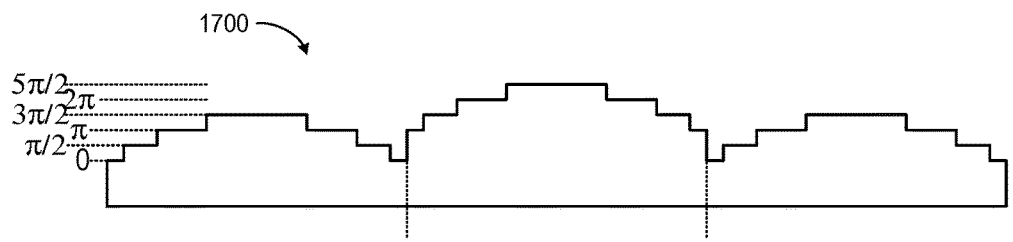
FIG. 17 is a cross-section of a phase grating 1700 in accordance with an embodiment that uses more than two levels to produce an odd symmetry.

FIG. 17 is a cross-section of a phase grating 1700 in accordance with an embodiment that uses more than two levels to produce an odd symmetry. Additional levels may allow for sharper focus, but may require more complex manufacturing processes. If gratings are to be made using photolithography, for example, additional levels require additional mask steps. Paired surfaces on either side of each boundary of odd symmetry introduce respective paired phase delays that differ by approximately half a wavelength, plus an integer number of wavelengths, over the wavelength band of interest.

Figure 18:
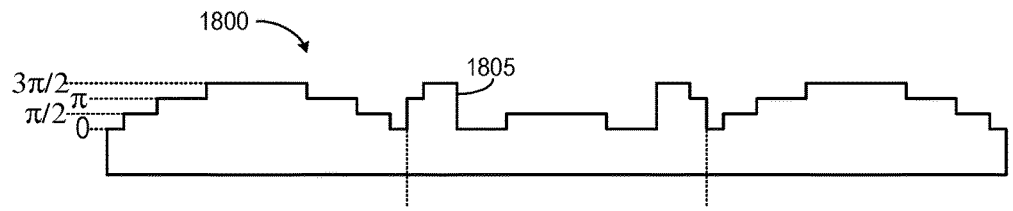
FIG. 18 is a cross-section of a phase grating 1800 that is optically similar to phase grating 1700 of FIG. 17, but uses fewer layers.

FIG. 18 is a cross-section of a phase grating 1800 that is optically similar to phase grating 1700 of FIG. 17, but uses fewer layers. The resultant larger abrupt discontinuities 1805 may introduce undesirable image artifacts or may be difficult to manufacture accurately, but the reduced number of levels may reduce manufacturing costs.

Figure 19:
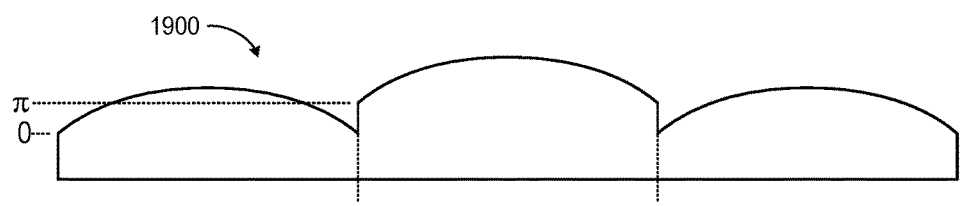
FIG. 19 is a cross-section of a phase grating 1900 that illustrates how odd symmetry can be extended to curved functions.

FIG. 19 is a cross-section of a phase grating 1900 that illustrates how odd symmetry can be extended to curved functions.

While the subject matter has been described in connection with specific embodiments, other embodiments are also envisioned. For example; while each grating detailed previously may be used in connection with photoreceptors to collect incident light, gratings in accordance with these and other embodiments can be used more generally in imaging devices that project images from photo-emitters rather than or in addition to sensing them; sensors of the type detailed above can be used with focusing optics (e.g., lenses and mirrors); the wavelength band of interest can be broader or narrower than the visible spectrum, may be wholly or partially outside the visible spectrum, and may be discontinuous; and cameras and gratings detailed herein can be adapted for use programmable-aperture applications. Other variations will be evident to those of skill in the art. Therefore, the spirit and scope of the appended claims should not be limited to the foregoing description. Only those claims specifically reciting "means for" or "step for"

should be construed in the manner required under the sixth paragraph of 35 U.S.C. § 112.

What is claimed is:

1. A system for imaging a scene, the system comprising:
    at least one photodetector array having a first region of pixels and a second region of pixels;
    a first phase grating overlying the first region of pixels, the first phase grating and the first region of pixels collectively exhibiting a first impulse response, the first region of pixels to sample first image data modulated by the first phase grating and representing the scene;
    a second phase grating overlying the second region of pixels, the second phase grating and the second region of pixels exhibiting a second impulse response different from the first impulse response, the second region of pixels to sample second image data modulated by the second phase grating and representing the scene; and
    circuitry to perform a first computational function on the first image data and a second computational function different from the first computational function on the second image data.

2. The system of claim 1, wherein first phase grating and the second phase grating exhibit the same point-source response.

3. The system of claim 2, further comprising a microlens array between the photodetector array and both of the first phase grating and the second phase grating.

4. The system of claim 3, the microlens array including first microlenses over the first region of pixels and exhibiting a first collective microlens response and second microlenses over the second region of pixels and exhibiting a second collective microlens response different from the first collective microlens response.

5. The system of claim 1, wherein the first phase grating includes first boundaries of odd symmetry and the second phase grating includes second boundaries of odd symmetry shaped differently than the first boundaries of odd symmetry.

6. The system of claim 1, wherein the first phase grating is geometrically similar to the second phase grating.

7. The system of claim 6, wherein the at least one photodetector array includes rows and columns of pixels, and wherein the first phase grating is rotated angularly about an axis perpendicular to the rows and columns of pixels.

8. The system of claim 6, wherein the at least one photodetector array includes rows and columns of pixels, and wherein the first phase grating is scaled larger than the second phase grating in a dimension parallel to the rows and columns of pixels.

9. The system of claim 1, wherein the first computational function transforms the first image data into first frequency-domain image data and the second computational function transforms the second image data into second frequency-domain image data.

10. The system of claim 9, the circuitry to compute a frequency-domain estimate of the scene by combining the first frequency-domain image data, the second frequency-domain image data, the first impulse response, and the second impulse response.

11. The system of claim 10, further comprising transforming the frequency-domain estimate into a pixel-domain image.

12. The system of claim 9, the circuitry to compute a first partial image from the first frequency-domain image data and the first impulse response, to compute a second partial image from the second frequency-domain image data and the second impulse response, and to combine the first partial image with the second partial image.

13. The system of claim 1, the circuitry to combine the first image data with the second image data and transform the combined image data into a frequency domain.

14. The system of claim 1, further comprising a first filter overlying only one of the first region of pixels and the second region of pixels.

15. The system of claim 1, the photodetector array to sample only one of the first image data and the second image data in a first mode and both the first image data and the second image data in a second mode.

16. The system of claim 15, the circuitry to transition from the first mode to the second mode responsive to the first computational function.

17. A method for imaging a scene, the method comprising:
    modulating first light from the scene using a first phase grating overlying a first region of pixels, the first phase grating and the first region of pixels collectively exhibiting a first impulse response;
    sampling the modulated first light incident the first region of pixels to acquire first image data representing the scene;
    modulating second light from the scene using a second phase grating overlying a second region of pixels, the second phase grating and the second region of pixels collectively exhibiting a second impulse response different from the first impulse response;
    sampling the modulated second light incident the second region of pixels to acquire second image data representing the scene; and
    perform a first computational function on the first image data and a second computational function different from the first computational function on the second image data.

18. The method of claim 17, wherein the first computational function transforms the first image data into first frequency-domain image data and the second computational function transforms the second image data into second frequency-domain image data.

19. The method of claim 18, further comprising computing a frequency-domain estimate of the scene by combining the first frequency-domain image data, the second frequency-domain image data, the first impulse response, and the second impulse response.

20. The method of claim 19, further comprising transforming the frequency-domain estimate into a pixel-domain image.

21. The method of claim 18, further comprising computing a first partial image from the first frequency-domain image data and the first impulse response, computing a second partial image from the second frequency-domain image data and the second impulse response, and combining the first partial image with the second partial image.

22. The method of claim 17, further comprising combining the first image data with the second image data and transforming the combined image data into a frequency domain.

23. The method of claim 17, further comprising sampling only one of the first image data and the second image data in a first mode and both the first image data and the second image data in a second mode.

24. The method of claim 23, further comprising transitioning from the first mode to the second mode responsive to the first computational function.

* * * * *